United States Patent
Matsushita

(10) Patent No.: US 11,516,952 B2
(45) Date of Patent: Nov. 29, 2022

(54) TAPE INCORRECT MOUNTING DETECTION SYSTEM

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 876 days.

(21) Appl. No.: 16/347,873

(22) PCT Filed: Nov. 9, 2016

(86) PCT No.: PCT/JP2016/083252
§ 371 (c)(1),
(2) Date: May 7, 2019

(87) PCT Pub. No.: WO2018/087847
PCT Pub. Date: May 17, 2018

(65) Prior Publication Data
US 2019/0313557 A1 Oct. 10, 2019

(51) Int. Cl.
*H05K 13/08* (2006.01)
*H05K 13/04* (2006.01)
(Continued)

(52) U.S. Cl.
CPC ......... *H05K 13/082* (2018.08); *G06T 1/0014* (2013.01); *H05K 13/02* (2013.01);
(Continued)

(58) Field of Classification Search
CPC .. G06T 1/0014; H05K 13/02; H05K 13/0419; H05K 13/082; H05K 13/084; H05K 13/086
See application file for complete search history.

(56) References Cited

U.S. PATENT DOCUMENTS 6,778,878 B1 * 8/2004 Kou ............... H05K 13/0417
700/95
9,310,789 B2 * 4/2016 Shimizu ............ H05K 13/084
(Continued)

FOREIGN PATENT DOCUMENTS

CN 104812229 A 7/2015
CN 104812230 A 7/2015
(Continued)

OTHER PUBLICATIONS

International Search Report issued in PCT/JP2016/083252; dated Feb. 7, 2017.

*Primary Examiner* — Carl J Arbes
(74) *Attorney, Agent, or Firm* — Studebaker & Brackett PC

(57) ABSTRACT

A tape erroneous mounting detection system includes sensors provided to the plurality of tape feeders, a reader configured to read identification information from a recording part which is provided to a reel, and a memory part configured to store part verification information. The tape erroneous mounting detection system also includes a part verification part configured to determine whether or not the tape is mounted on the tape feeder at the set position, and to perform verification updating processing, and a tape erroneous mounting detection part configured to perform erroneous mounting detection processing where the tape erroneous mounting detection part identifies the tape feeder on which the tape is mounted based on the tape presence or absence information and the output from the sensor, and the tape erroneous mounting detection part detects that the tape mounted on the tape feeder is erroneously mounted.

20 Claims, 20 Drawing Sheets

(51) Int. Cl.
  *G06T 1/00*  (2006.01)
  *H05K 13/02*  (2006.01)
(52) U.S. Cl.
  CPC ....... *H05K 13/0419* (2018.08); *H05K 13/084* (2018.08); *H05K 13/086* (2018.08)

(56) References Cited

U.S. PATENT DOCUMENTS

| | | | |
|---|---|---|---|
| 9,669,980 B2* | 6/2017 | Koyanagi | H05K 3/30 |
| 9,801,318 B2* | 10/2017 | Sumi | H05K 13/0417 |
| 2003/0225547 A1* | 12/2003 | Paradies | H05K 13/0882 |
| | | | 702/150 |
| 2005/0036274 A1* | 2/2005 | Suhara | H05K 13/0417 |
| | | | 361/600 |
| 2006/0207089 A1* | 9/2006 | Maenishi | H05K 13/084 |
| | | | 700/114 |
| 2015/0033555 A1* | 2/2015 | Mizokami | H05K 13/085 |
| | | | 29/832 |
| 2015/0034714 A1 | 2/2015 | Koyanagi et al. | |
| 2015/0110588 A1 | 4/2015 | Ohyama et al. | |
| 2015/0212503 A1 | 7/2015 | Shimizu et al. | |
| 2015/0212519 A1 | 7/2015 | Sumi | |
| 2018/0042152 A1 | 2/2018 | Ohyama et al. | |

FOREIGN PATENT DOCUMENTS

| | | | |
|---|---|---|---|
| JP | 2000-068690 A | * | 3/2000 |
| JP | 2000-68697 | * | 3/2000 |
| JP | 2003-347790 A | * | 12/2003 |
| JP | 4629637 B | * | 4/2008 |
| JP | 2008-294097 A | | 12/2008 |
| JP | 2014-011291 A | | 1/2014 |
| JP | 2014-011328 A | | 1/2014 |
| WO | 2013136440 A1 | | 9/2013 |

* cited by examiner

FIG.10

| SET POSITION | PART ID | PART NAME | ... |
|---|---|---|---|
| F001 | P12345 | PARTS-001 | ... |
| F002 | P22345 | PARTS-002 | ... |
| F003 | P22346 | PARTS-010 | ... |
| F004 | P23345 | PARTS-011 | ... |
| F005 | P23346 | PARTS-012 | ... |
| ... | ... | ... | ... |

TAPE INCORRECT MOUNTING DETECTION SYSTEM

CROSS-REFERENCE TO RELATED APPLICATION

This application is a National Stage of International Patent Application No. PCT/JP2016/083252, filed Nov. 9, 2016, the entire content of which is incorporated herein by reference.

BACKGROUND

Technical Field

The present disclosure relates to a technique for automatically mounting parts using a part mounting device provided with a tape feeder, and more particularly to a technique for detecting a case where a tape for supplying parts is not properly mounted on a tape feeder.

Background Art

A part mounting device includes tape feeders each of which supplies parts using a tape as a carrier. The tape feeder is provided for supplying parts to a predetermined part takeout position while intermittently feeding a tape which stores the parts (part supply tape) from a reel around which the tape is wound. In the part mounting device, a plurality of tape feeders are arranged parallel to each other and the parts supplied from these tape feeders are picked up by heads for mounting parts and are placed (mounted) on a substrate such as a circuit board.

With respect to the tape feeder, conventionally, there has been known a splicing method where an operator manually mounts a tape along a traveling path in the tape feeder, and when a remaining amount of the tape which precedes (preceding tape) becomes small, a succeeding new tape (succeeding tape) is joined to a tail end of the preceding tape thus enabling continuous supply of parts. However, recently, to improve efficiency of a part replenishing operation, a tape feeder adopting a splicing-less method (also referred to as an automatic loading method) has been becoming mainstream. In the case of the tape feeder adopting a splicing-less method, when a distal end of a tape is set at a predetermined position, the tape can be automatically loaded to a part takeout position in response to a button operation. Further, when a distal end of a succeeding tape for part replenishment is set at the predetermined position, after the entire preceding tape is fed out, the succeeding tape is automatically loaded to the part takeout position, and an intermittent tape feeding operation of the succeeding tape is started. With such a configuration, an operator is set free from a tape loading operation and a tape joining operation which are cumbersome. That is, it is possible to improve efficiency of so-called preparation operation and part replenishing operation of the tape feeder. For example, the third embodiment in JP 2014-11328 A discloses one example of a tape feeder adopting a splicing-less method of this type.

In the tape feeder adopting a splicing-less method (hereinafter, simply referred to as the tape feeder), in setting a tape (also including a succeeding tape), it is necessary to verify whether or not the tape is correct, that is, whether or not parts are correct. Accordingly, for example, a barcode attached to a reel is read by a barcode reader, and it is determined whether or not barcode information and feeder information necessary for setting the reel agree with each other, and if these two sets of information do not agree with each other, an alarm is set off so as to inform an operator of this result.

However, in the case where the above-mentioned configuration is adopted, a following drawback arises. That is, when reading of a barcode is forgotten after setting a tape, the above-mentioned verification is not performed. In this case, even if the set tape is correct, automatic loading is not performed. As a result, there is a concern that a trouble such as a tape feeding defect occurs.

Further, in the case where a tape which is loaded once is removed and an operator loads the tape on a wrong tape feeder or in the case where an irrelevant tape is placed by accident and an operator erroneously loads the tape on any one of tape feeders, there is a concern that a similar trouble occurs eventually.

SUMMARY

Accordingly, the present disclosure provides a technique for automatically mounting parts using a part mounting device provided with a tape feeder, and more particularly to a technique for detecting a case where a tape is not properly mounted on the tape feeder.

The present disclosure provides a tape erroneous mounting detection system disposed in a part supply unit where a plurality of tape feeders are arranged and provided for detecting that a tape for supplying a part is erroneously mounted on the tape feeder. The tape erroneous mounting detection system includes sensors provided to the plurality of tape feeders, with the sensors being configured to detect tapes, respectively; a reader configured to read identification information of an accommodated part from a recording part which records the identification information and is provided to a tape or a reel around which the tape is wound; and a memory part configured to store part verification information obtained by correlating set position information which is information on a set position of the tape feeders in the part supply unit with the identification information. The tape erroneous mounting detection system further includes a part verification part configured to determine whether or not the tape is mounted on the tape feeder at the set position corresponding to the identification information read by the reader based on the identification information read by the reader, the part verification information, and an output from the sensor, and configured to perform verification updating processing so as to update tape presence or absence information at the set position in a case where determination is made that the tape is mounted on the tape feeder; and a tape erroneous mounting detection part configured to perform erroneous mounting detection processing where the tape erroneous mounting detection part identifies the tape feeder on which the tape is mounted based on the tape presence or absence information and the output from the sensor, and the tape erroneous mounting detection part detects that the tape mounted on the tape feeder is erroneously mounted during a period which differs from a period where the verification updating processing is performed.

BRIEF DESCRIPTION OF THE DRAWINGS

FIG. 10 is a conceptual view showing one example of part verification data stored in a database;

DETAILED DESCRIPTION

[Configuration of Part Mounting Device]

Figure 1:
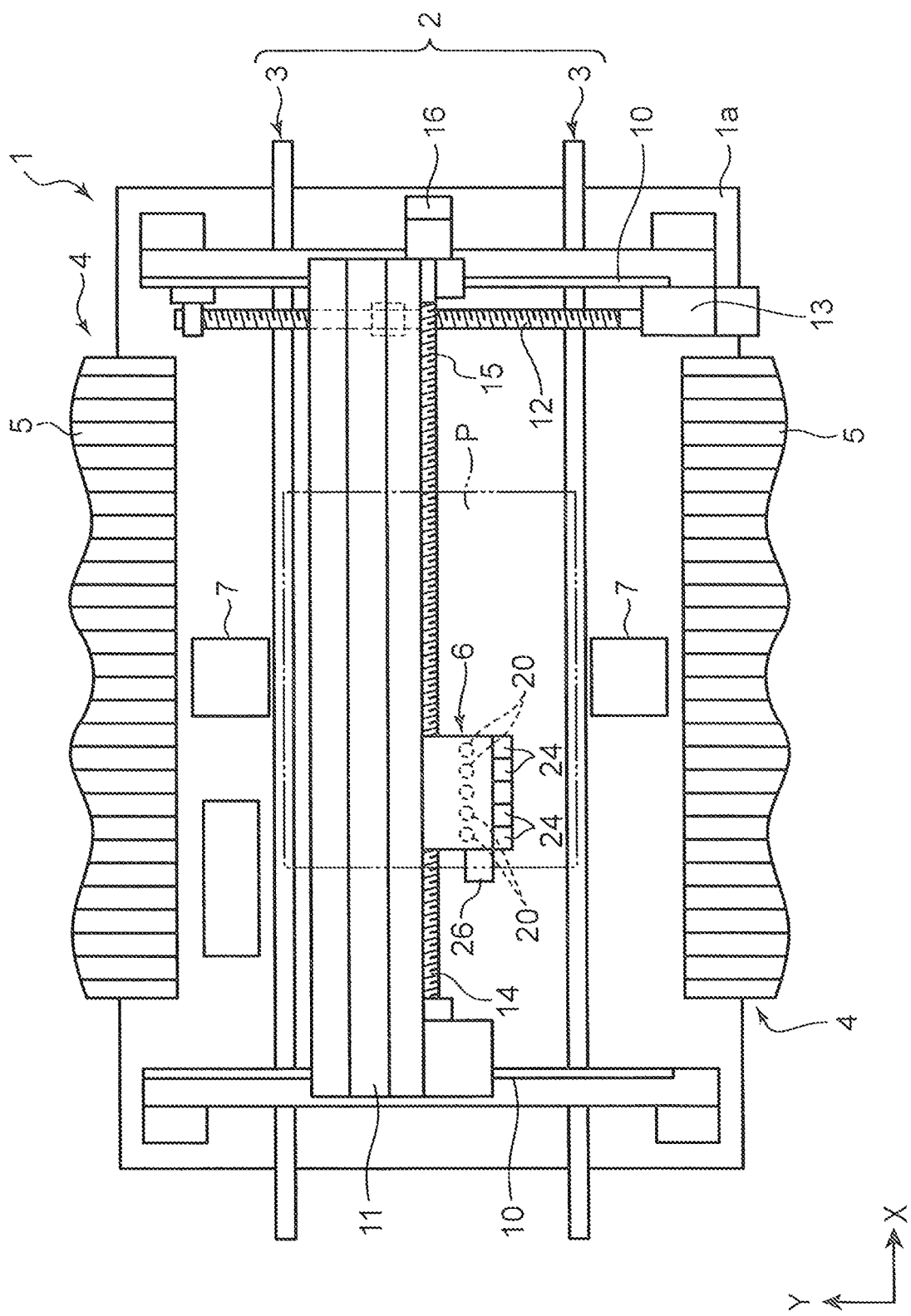
FIG. 1 is a plan view of a part mounting device.

FIG. 1 is a plan view of a part mounting device to which the present disclosure is applied. In the drawings, to clarify a directional relationship in each drawing, XYZ orthogonal coordinate axes are shown. An X direction is a direction parallel to a horizontal plane, a Y direction is a direction orthogonal to the X direction on the horizontal plane, and a Z direction is a direction orthogonal to both of X and Y directions.

The part mounting device 1 includes: a base 1a having a rectangular shape as viewed in a plan view; a substrate conveyance mechanism 2 for conveying a substrate P such as a printed circuit board on the base 1a; part supply units 4; a head unit 6; and a head unit drive mechanism for driving the head unit 6.

The substrate conveyance mechanism 2 includes: a pair of conveyors 3 for conveying the substrate P in the X direction; and a positioning mechanism, not shown, for positioning the substrate P to be conveyed by the conveyor 3. The conveyor 3 is a so-called belt conveyor. The conveyor 3 receives the substrate P from one side (right side in FIG. 1), conveys the substrate P to a predetermined mounting operation position (the position of the substrate P shown in the drawing), and after such a mounting operation, carries out the substrate P to the other side (left side in FIG. 1). The positioning mechanism is a lift-up mechanism provided with a backup pin. The positioning mechanism positions the substrate P at the mounting operation position by lifting the substrate P from the conveyor 3 and pressing the substrate P to a lower surface of a conveyance guide or the like not shown.

The part supply units 4 are disposed on both sides (both sides in the Y direction) of the substrate conveyance mechanism 2 respectively. In this embodiment, each part supply unit 4 is integrally assembled to the base 1a. That is, each part supply unit 4 is inseparably incorporated in the base 1a.

In the part supply unit 4, a plurality of tape feeders 5 are detachably disposed along the conveyor 3. The tape feeder 5 is provided for supplying a small-piece-like electronic parts such as ICs, transistors, or capacitors (hereinafter, simply referred to as parts) using a tape as a carrier. The configuration of the tape feeder 5 is described in detail later.

The head unit 6 is provided for taking out a part from each tape feeder 5 of the part supply unit 4 and for mounting the part on the substrate P. The head unit 6 moves in the X direction as well as in the Y direction within a fixed region due to an operation of a head unit drive mechanism The head unit drive mechanism includes: a pair of fixed rails 10 fixed to high-bridge frames respectively and extending in the Y direction; a unit support member 11 movably supported on the respective fixed rails 10 and extending in the X direction; and a ball screw shaft 12 threadedly inserted into the unit support member 11 and driven by a Y-axis servo motor 13. The head unit drive mechanism also includes: a fixed rail 14 fixed to the unit support member 11 and movably supporting the head unit 6 in the X direction; and a ball screw shaft 15 threadedly inserted into the head unit 6 and driven by an X-axis servo motor 16. That is, the head unit drive mechanism moves the head unit 6 in the X direction due to driving of the ball screw shaft 15 by the X-axis servo motor 16, and moves the unit support member 11 in the Y direction due to driving of the ball screw shaft 12 by the Y-axis servo motor 13. As a result, the head unit 6 moves in the X direction as well as in the Y direction within the fixed region.

In this embodiment, the head unit drive mechanism is configured to move the unit support member 11 and the head unit 6 by the rotary motors (servo motors 13, 16) by way of the ball screw shafts 12, 15. However, the head unit drive mechanism may be configured to directly drive the unit support member 11 and the head unit 6 using, for example, linear motors as drive sources.

The head unit 6 includes a plurality of shaft-like heads 20; and a head drive mechanism for driving these heads 20. In this embodiment, the head unit 6 includes five heads 20 in total arranged in a row in the X direction.

The head drive mechanism includes: a lifting drive mechanism which includes Z-axis servo motors 24 which respectively correspond to the respective heads 20 and individually raises or lowers the respective heads 20 (moves the respective heads 20 in the Z direction); and a rotary drive mechanism which includes one R-axis servo motor 25 (shown in FIG. 9) shared in common by the respective heads 20 and rotates the respective heads 20 simultaneously about a head center axis (R direction).

A nozzle for sucking a part is provided to a distal end of each head 20. The respective nozzles communicate with a negative pressure generating device by way of electrically operated switching valves, respectively. When a negative pressure is supplied to the distal end of the nozzle from the negative pressure generating device, the nozzle sucks the part.

The head unit 6 also includes a substrate recognition camera 26. The substrate recognition camera 26, for identifying a type of the substrate P and for positioning the substrate P, moves together with the head unit 6, and images various marks described on an upper surface of the substrate P from above.

As shown in FIG. 1, the part recognition cameras 7 are disposed at positions between the respective part supply units 4 and the substrate conveyance mechanism 2 on the base 1a respectively. The part recognition camera 7 images a part taken out from the tape feeder 5 by the head 20 from below for recognizing a suction state of the part.

[Overall Configuration of Tape Feeder 5]

Figure 2:
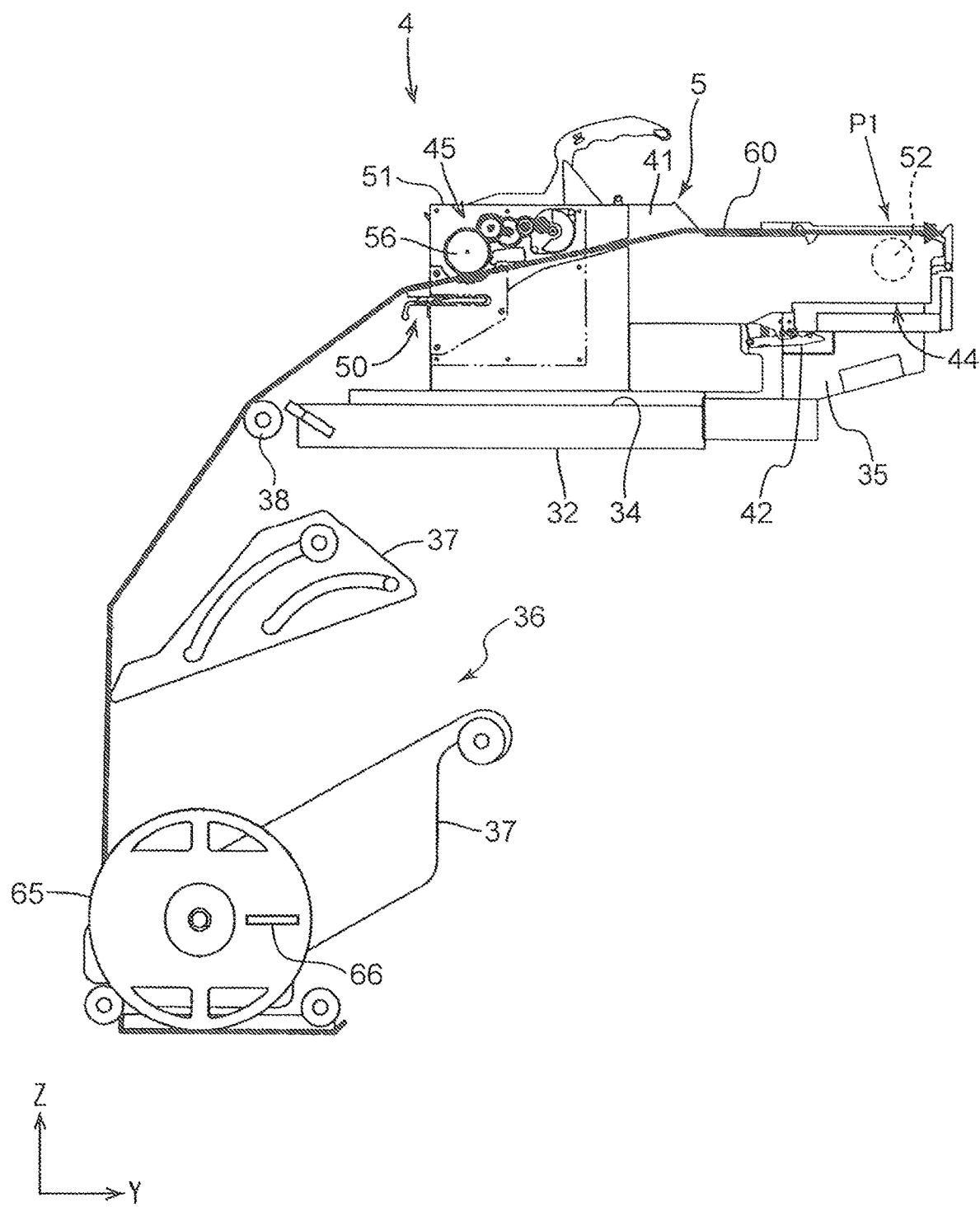
FIG. 2 is an overall schematic view of a part supply unit and a tape feeder as viewed from a side.
Figure 3:
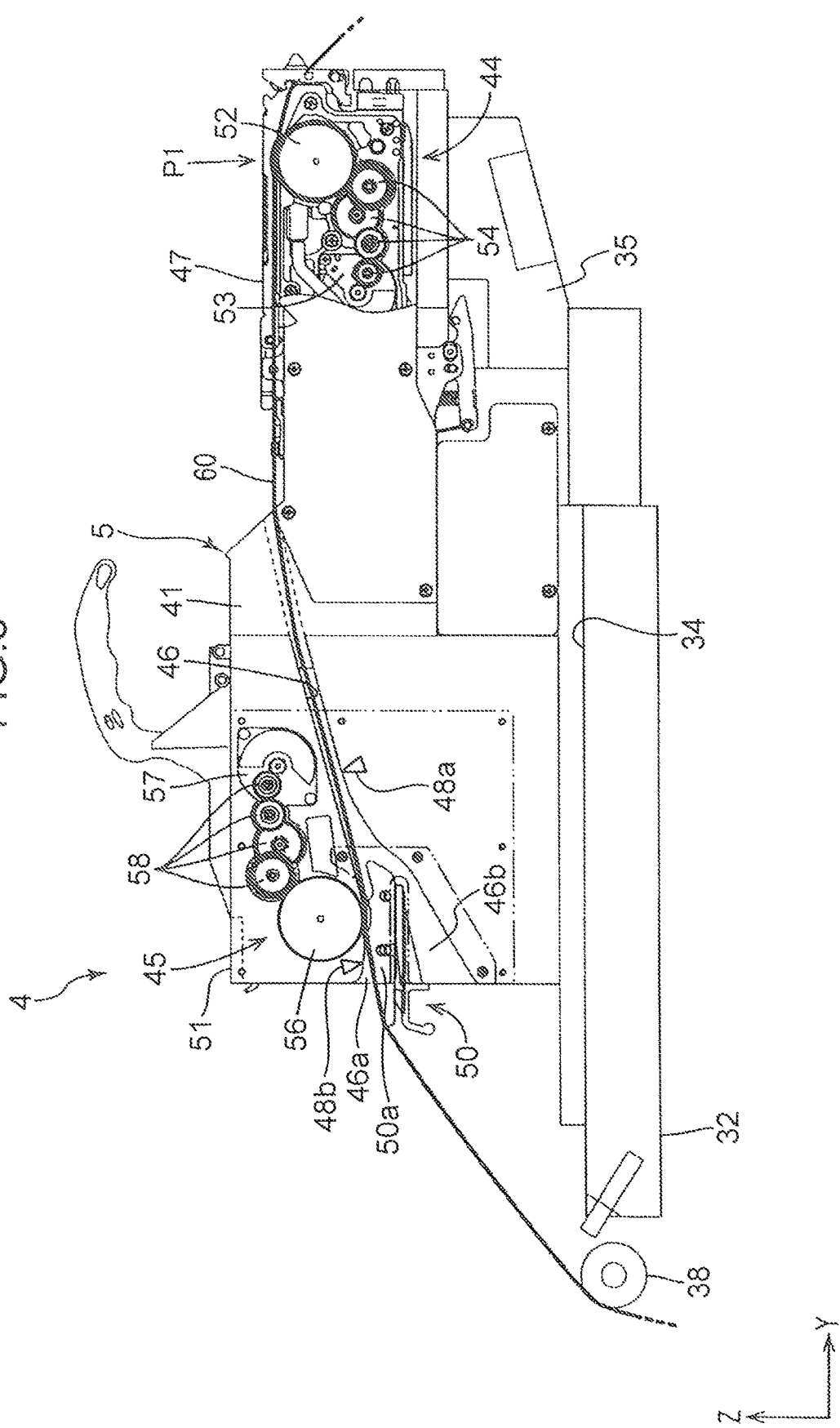
FIG. 3 is a schematic view of the tape feeder as viewed from a side.

FIG. 2 is an overall schematic view of the part supply unit 4 and the tape feeder 5 as viewed from a side, and FIG. 3 is a schematic view of the tape feeder as viewed from a side (an enlarged view of an essential part in FIG. 2). In the description of the tape feeder 5 and the part supply unit 4 made hereinafter, for the sake of convenience of the description, assume a side close to the substrate conveyance mechanism 2 (a right side in FIG. 2 and FIG. 3) as front (front side) and a side opposite to the above-mentioned side as rear (rear side).

The tape feeder 5 is mounted on a feeder mounting part 32 mounted on the part supply unit 4. To describe in detail, the part supply unit 4 includes the feeder mounting part 32 and a reel support portion 36. The feeder mounting part 32 includes: a plurality of slots 34 arranged at a fixed interval in the X direction and extending parallel to each other in the Y direction; and a fixing base 35 extending in the X direction at the position in front of these slots 34. The tape feeders 5 are set in the respective slots 34, and the respective tape feeders 5 are fixed to the fixing base 35 by a clamp mechanism 42. With such a configuration, the plurality of tape feeders 5 are disposed in the part supply unit 4 in a row side by side in the X direction.

In the reel support portion 36, reels 65 on which part supply tapes 60 are wound are supported for respective slots 34, and the part supply tapes 60 are reeled from the reel 65 to the tape feeders 5. The reel support portion 36 is positioned behind and below the feeder mounting part 32, and includes reel holders 37 which rotatably support the reel 65 at two stages, that is, upper and lower stages. Reference numeral 38 in FIG. 2 and FIG. 3 indicates a guide roller for guiding the part supply tapes 60 reeled out from the reel 65 toward the tape feeders 5, and provided at a rear end portion of the feeder mounting part 32 corresponding to the respective slots 34.

The tape feeder 5 includes: a feeder body portion 41 having an elongated shape in the longitudinal direction (Y direction); and the clamp mechanism 42 disposed in front of and below the feeder body portion 41. The tape feeder 5 is fixed to the fixing base 35 by the clamp mechanism 42 in a state where the feeder body portion 41 is inserted (set) in the slot 34.

The tape feeder 5 also includes: a front side feeding portion 44 disposed on a front end portion of the feeder body portion 41; a rear side feeding portion 45 disposed at a rear end portion of the feeder body portion 41; a tape path 46 formed in the feeder body portion 41; a tape guide 47; first and second tape detection sensors 48a, 48b; a feeder control part 49 (see FIG. 9); a tape support member 50 detachably fixed to a rear end portion of the feeder body portion 41; and an operation part 51 disposed on an upper surface of a rear portion of the feeder body portion 41.

The tape path 46 is a path for guiding the part supply tape 60. The tape path 46 extends from a rear end portion of the feeder body portion 41 obliquely and upwardly toward an upper portion of a front side of the feeder body portion 41. As shown in FIG. 3, the part supply tape 60 is introduced into the feeder body portion 41 from the rear end portion of the feeder body portion 41, and is guided to a front portion of an upper surface of the feeder body portion 41 through the tape path 46.

Figure 4:
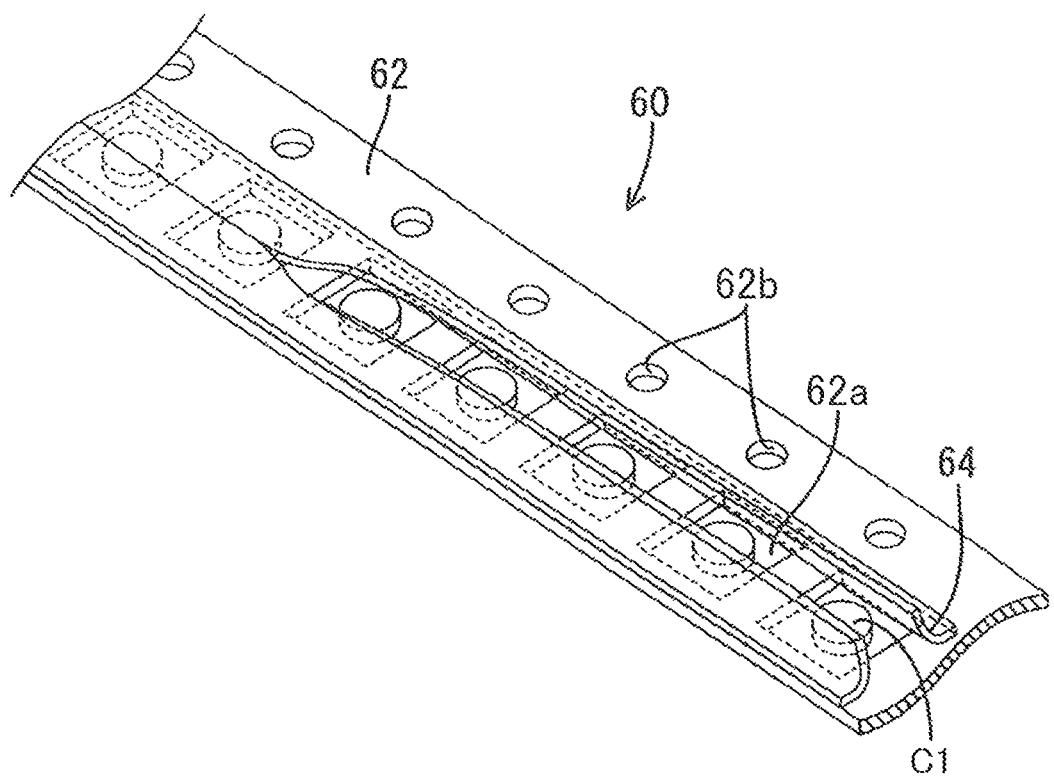
FIG. 4 is a perspective view of a part supply tape.

As shown in FIG. 4, the part supply tape 60 is an elongated tape formed of a tape body 62 and a cover tape 64.

A large number of part accommodating portions 62a (recessed portions) which open upward are formed in the tape body 62 at a fixed interval in the longitudinal direction, and a part C1 is accommodated in the respective part accommodating portions 62a. The cover tape 64 adheres to an upper surface of the tape body 62 so as to seal the respective part accommodating portions 62a by the cover tape 64. A plurality of engaging holes 62b which are arranged at a fixed interval in the longitudinal direction and penetrate the tape body 62 in a thickness direction of the tape body 62 are formed in the tape body 62 on a side of the part accommodating portions 62a.

As shown in FIG. 2, the part supply tape 60 is wound around the reel 65. The reel 65 is rotatably supported by the reel holder 37. The part supply tape 60 is reeled out from the reel 65, and is guided to a front portion of the upper surface of the feeder body portion 41 through the tape path 46.

As shown in FIG. 3, the tape guide 47 is disposed on the upper surface of the front portion of the feeder body portion 41. The tape guide 47 covers the part supply tape 60 which passes the tape path 46, and is provided for guiding the part supply tape 60 to a part supply position P1 approximately horizontally along the upper surface of the feeder body portion 41. The part supply position P1 is the position where a part is taken out by the head 20, and is set at the position close to the front end of the upper surface of the feeder body portion 41.

An opening portion not shown is formed in the tape guide 47 at the position corresponding to the part supply position P1, and a cut mechanism not shown for cutting the cover tape 64 is disposed at the position behind the opening portion. As shown in FIG. 4, the cut mechanism is configured to fold the cover tape 64 toward the outside while cutting the cover tape 64 in the longitudinal direction at the center of the cover tape 64 in the width direction. With such a configuration, the parts C1 accommodated in the part accommodating portions 62a are exposed at the part supply position P1 so as to enable sucking of the parts by the heads 20 through the opening portion.

The front side feeding portion 44 includes: a front side sprocket 52 disposed below the tape guide 47; a front side motor 53; and a front side gear train 54 which transmits a drive force of the front side motor 53 to the front side sprocket 52 and is formed of a plurality of power transmission gears. The front side sprocket 52 has teeth which engage with the engaging hole 62b of the part supply tape 60 guided along the tape guide 47. That is, the front side feeding portion 44 feeds the part supply tape 60 toward the part supply position P1 by rotatably driving the front side sprocket 52 by the front side motor 53.

The rear side feeding portion 45 includes: a rear side sprocket 56 disposed on a rear end portion of the feeder body portion 41; a rear side motor 57; and a rear side gear train 58 which transmits a drive force of the rear side motor 57 to the rear side sprocket 56 and is formed of a plurality of power transmission gears. The rear side sprocket 56 has teeth which face the inside of the tape path 46 from above and engage with the engaging holes 62b of the part supply tape 60 guided along the tape path 46. That is, the rear side feeding portion 45 feeds the part supply tape 60 toward a front side (part supply position P1) by rotatably driving the rear side sprocket 56 by the rear side motor 57.

The part supply tape 60 is fed toward the part supply position P1 by the respective feeding portions 44, 45, and the parts are taken out through the opening portion at the part supply position P1. A tape recovery container not shown is disposed in front of the reel support portion 36. As shown in FIG. 3, the part supply tape 60 is guided downward from a front end of the feeder body portion 41 after the parts are taken out from the part supply tape 60, and is recovered in the tape recovery container while being finely shredded by a cutter not shown.

As shown in FIG. 3, the tape support member 50 divides a rear end portion of the tape path 46 into two upper and lower paths (an upper side path 46a, a lower side path 46b), and supports from below the part supply tape 60 which passes the upper side path 46a. To describe in detail, a rear end portion of the tape path 46 has a shape expanding in a vertical direction from a front side to a rear side of the rear end portion. The tape support member 50 is inserted in the tape path 46 from behind the feeder body portion 41, and is detachably fixed to the feeder body portion 41. With such a configuration, the rear end portion of the tape path 46 is divided into the upper side path 46a and the lower side path 46b by the tape support member 50.

As described previously, the rear side sprocket 56 faces the inside of the upper side path 46a, and engages with the engaging holes 62b formed in the part supply tape 60 which passes the upper side path 46a. The tape support member 50 includes a support lug 50a which is elastically displaceable in the vertical direction, and the part supply tape 60 which passes the upper side path 46a is biased by the support lug 50a upward. With such a configuration, the part supply tape 60 is pressed to the rear side sprocket 56.

A first tape detection sensor 48a and a second tape detection sensor 48b are disposed in a state where both the tape detection sensors 48a, 48b face the tape path 46, and both the tape detection sensors 48a, 48b detect the presence or the absence of the part supply tape 60 which passes the tape path 46. More specifically, the first tape detection sensor 48a is disposed at the position in front of (on a right side in FIG. 3) a place where the upper side path 46a and the lower side path 46b merge with each other and the first tape detection sensor 48a faces the tape path 46 from below. On the other hand, the second tape detection sensor 48b is disposed at the position where the second tape detection sensor 48b faces the upper side path 46a from above. With such a configuration, the presence or the absence of the part supply tape 60 in the upper side path 46a is detected.

The operation part 51 is provided for allowing an operator to feed and reverse-feed the part supply tape 60 as necessary. The operation part 51 includes: operation buttons 51a for performing feeding of the tape and reverse feeding of the tape; and an LED display part 51b (see FIG. 9) showing an operation state of the tape feeder 5 and the like.

The feeder control part 49 is provided for controlling driving of the tape feeder 5. Specifically, the feeder control part 49 controls driving of the front side motor 53 and the rear side motor 57 based on an operation of the operation button 51a. The feeder control part 49 controls the LED display part 51b for notifying an operation state of the tape feeder 5 and the like. Although not shown in the drawing, the feeder mounting part 32 includes a connector for electrically connecting the respective tape feeders 5 and a controller 70, described later, of the part mounting device 1 to each other. The feeder control part 49 is electrically connected to the controller 70 via the connector or the like. That is, the feeder control part 49 controls driving of the tape feeder 5 corresponding to an operation when the operation part 51 receives such an operation, and controls driving of the tape feeder 5 based on a control signal input from the controller 70. In this embodiment, the second tape detection sensor 48b corresponds to "sensor" of the present disclosure and the LED display part 51b corresponds to a display part and a notification part of the present disclosure.

[Method of Mounting Part Supply Tape 60]

The above-mentioned tape feeder 5 is a tape feeder adopting a so-called splicing-less method. That is, in the tape feeder 5, when a distal end of the part supply tape 60 is set on the upper side path 46a and the operation button 51a is operated, the part supply tape 60 is automatically loaded at the part takeout position P1. On the other hand, by setting the part supply tape 60 for part replenishment in the upper side path 46a, after the whole preceding part supply tape 60 mounted on the tape feeder 5 is fed, the succeeding part supply tape 60 is automatically loaded at the part supply position P1. Hereinafter, a method of mounting the part supply tape 60 on the tape feeder 5 is described.

Firstly, the method of mounting the preceding part supply tape 60 is described.

An operator fixes the tape support member 50 to the feeder body portion 41, and mounts the reel 65 on the reel holder 37 at the lower stage of the reel support portion 36. In such an operation, to perform verification of a part, the operator reads a barcode 66 (part ID) described later which is laminated to the reel 65 by a barcode reader 84 described later. This point is further described in detail later.

Then, the part supply tape 60 is reeled out from the reel 65, and the distal end portion of the part supply tape 60 is inserted into the upper side path 46a from behind the feeder body portion 41. With such an operation, the distal end portion of the part supply tape 60 is supported on the tape support member 50 (support lug 50a) in a state where the distal end portion of the part supply tape 60 is engaged with the rear side sprocket 56.

Next, the operator presses the operation button 51a (tape feeding button) to load the part supply tape 60. Specifically, as shown in FIG. 2 and FIG. 3, the part supply tape 60 is fed to the position where the distal end portion of the part supply tape 60 engages with the front side sprocket 52. With such an operation, mounting of the preceding part supply tape 60 on the tape feeder 5 is completed.

During the part mounting operation, driving of the front side motor 53 is controlled by the feeder control part 49 based on a control signal output from the controller 70 in accordance with a mounting program. With such an operation, the part supply tape 60 is fed intermittently along with taking out of the parts by the heads 20. The rear side sprocket 56 is configured to idly rotate along with feeding of the part supply tape 60 in mounting the part. Accordingly, the rear side motor 57 is stopped in principle except for a time for loading the part supply tape 60.

Next, the method of mounting the succeeding part supply tape 60 is described with reference to FIG. 5 to FIG. 8. In FIG. 5 to FIG. 8, to differentiate the tapes, a letter "P" is affixed to a symbol of the preceding part supply tape 60, and a letter "F" is affixed to a symbol of the succeeding part supply tape 60.

Figure 5:
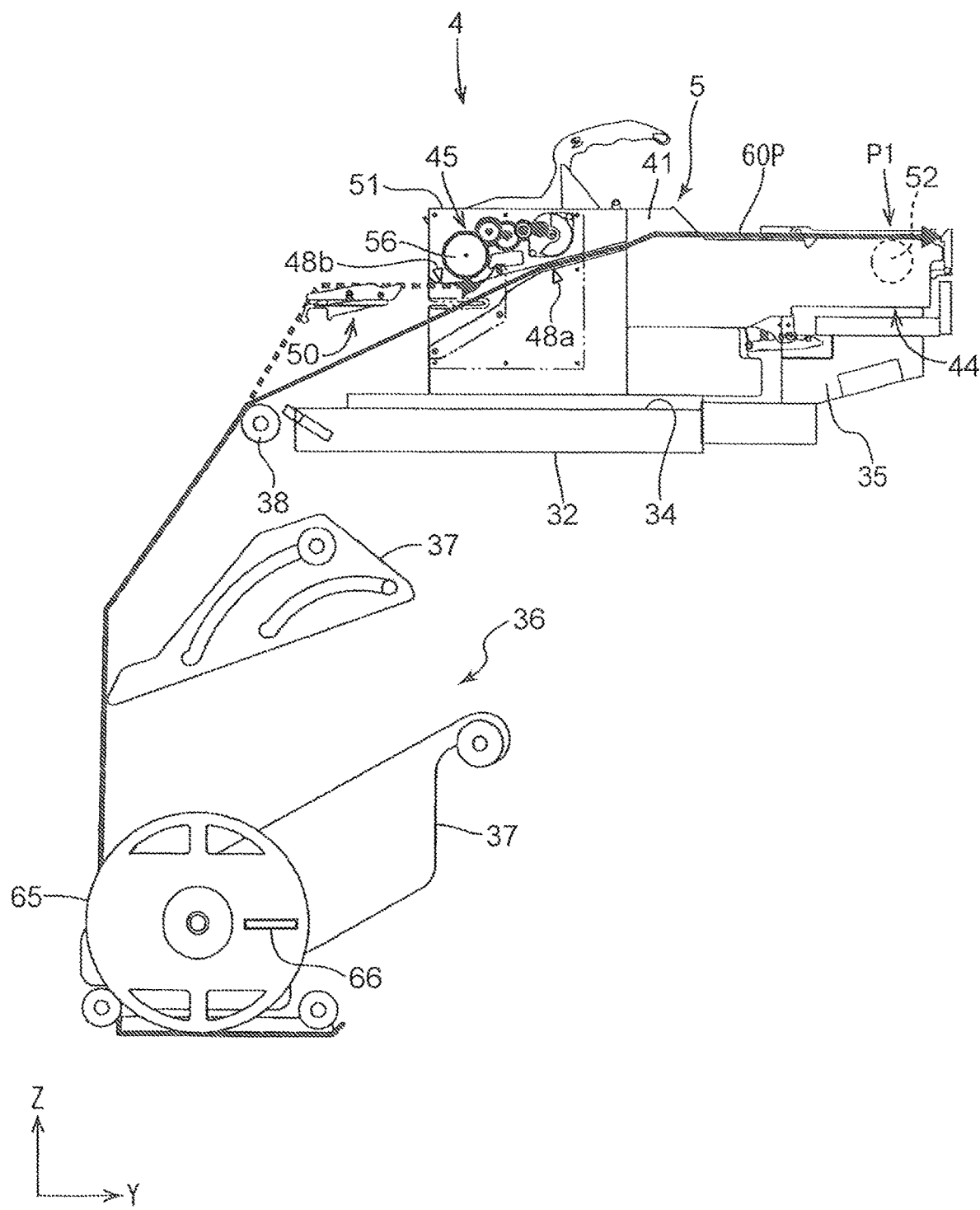
FIG. 5 is an explanatory view of a method of mounting a succeeding tape.

Firstly, an operator removes the tape support member 50 from the feeder body portion 41. When the tape support member 50 is removed, as shown in FIG. 5, the preceding part supply tape 60P is displaced to a bottom surface portion of the tape path 46 due to its own weight. Accordingly, the preceding part supply tape 60P is separated from the rear side sprocket 56 and hence, the engagement between the preceding part supply tape 60 and the rear side sprocket 56 is released.

Figure 6:
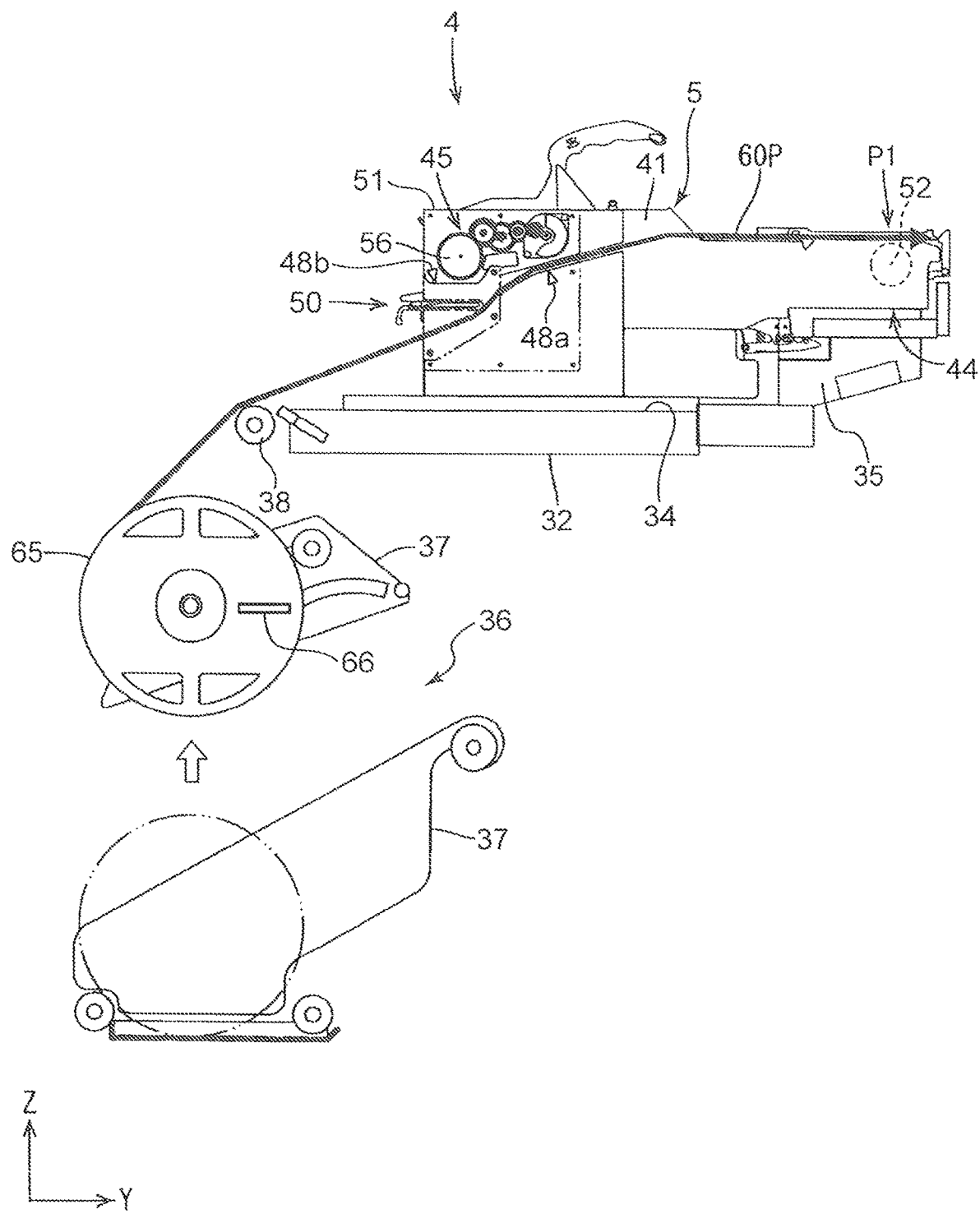
FIG. 6 is an explanatory view of the method of mounting a succeeding tape.

Next, the operator mounts the tape support member 50 on the feeder body portion 41, and as shown in FIG. 6, the reel 65 around which the preceding part supply tape 60P is wound is transferred from the reel holder 37 on a lower stage to the reel holder 37 on an upper stage.

Figure 7:
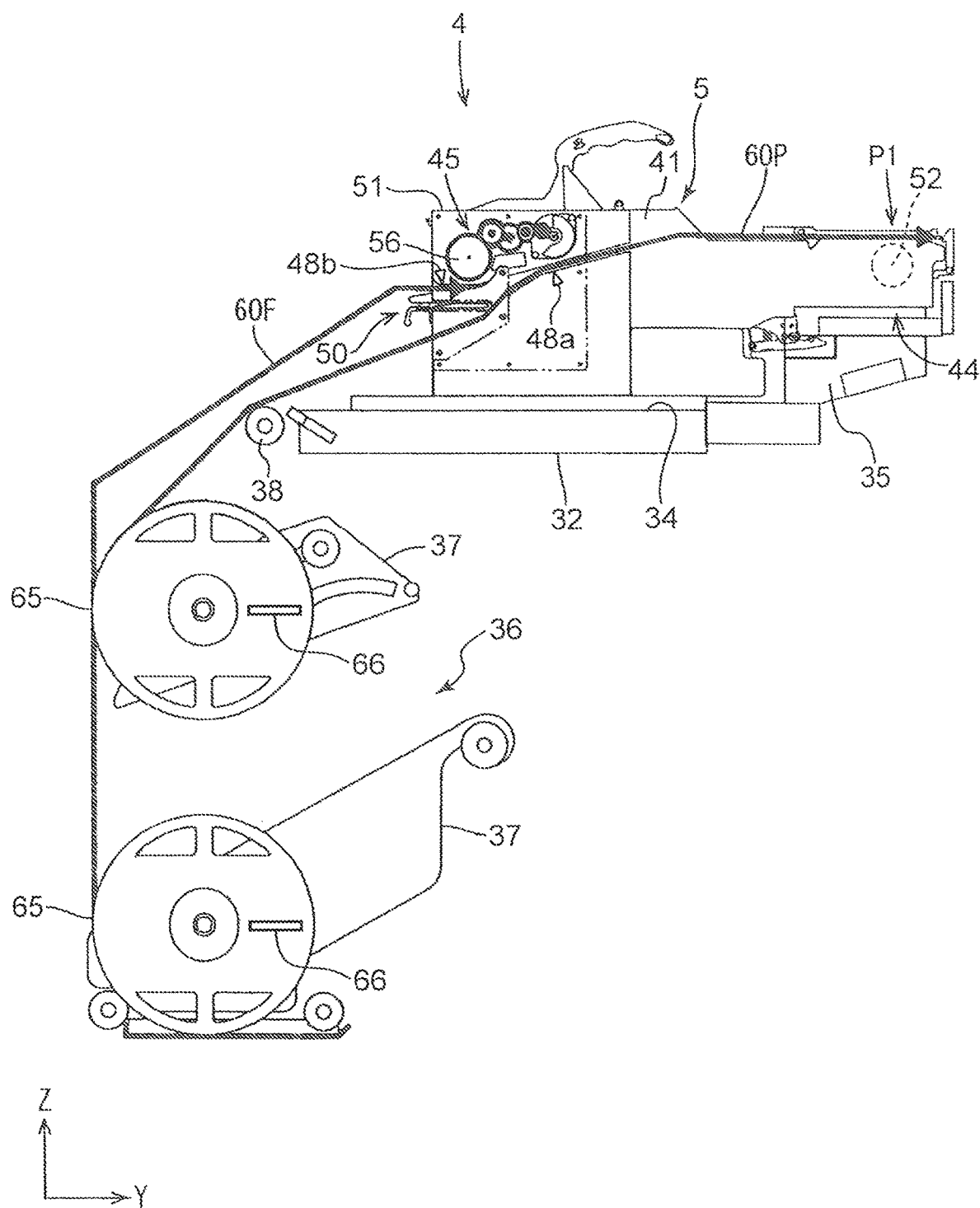
FIG. 7 is an explanatory view of the method of mounting the succeeding tape.

Then, as shown in FIG. 7, the reel 65 around which the succeeding part supply tape 60F is wound is mounted on the reel holder 37 on a lower stage, the part supply tape 60F is reeled out from the reel 65, and the distal end portion of the part supply tape 60F is set on the upper side path 46a from behind the feeder body portion 41. That is, the distal end portion of the part supply tape 60F is inserted into the upper side path 46a, and the distal end portion is supported on the support lug 50a in a state where the distal end portion is made to engage with the rear side sprocket 56. With such an operation, mounting of the succeeding part supply tape 60F on the tape feeder 5 is completed. Also setting the succeeding part supply tape 60F, in the same manner as the case of the preceding part supply tape 60P, for verification of a part, a barcode 66 (part ID) described later which is laminated to the reel 65 is read using the barcode reader 84 described later.

Mounting of the succeeding part supply tape 60F on the tape feeder 5 does not obstruct feeding of the preceding part supply tape 60P at all. Accordingly, mounting of the succeeding part supply tape 60F on the tape feeder 5 can be performed without any trouble in a state where the preceding part supply tape 60P is being mounted on the tape feeder 5.

Figure 8:
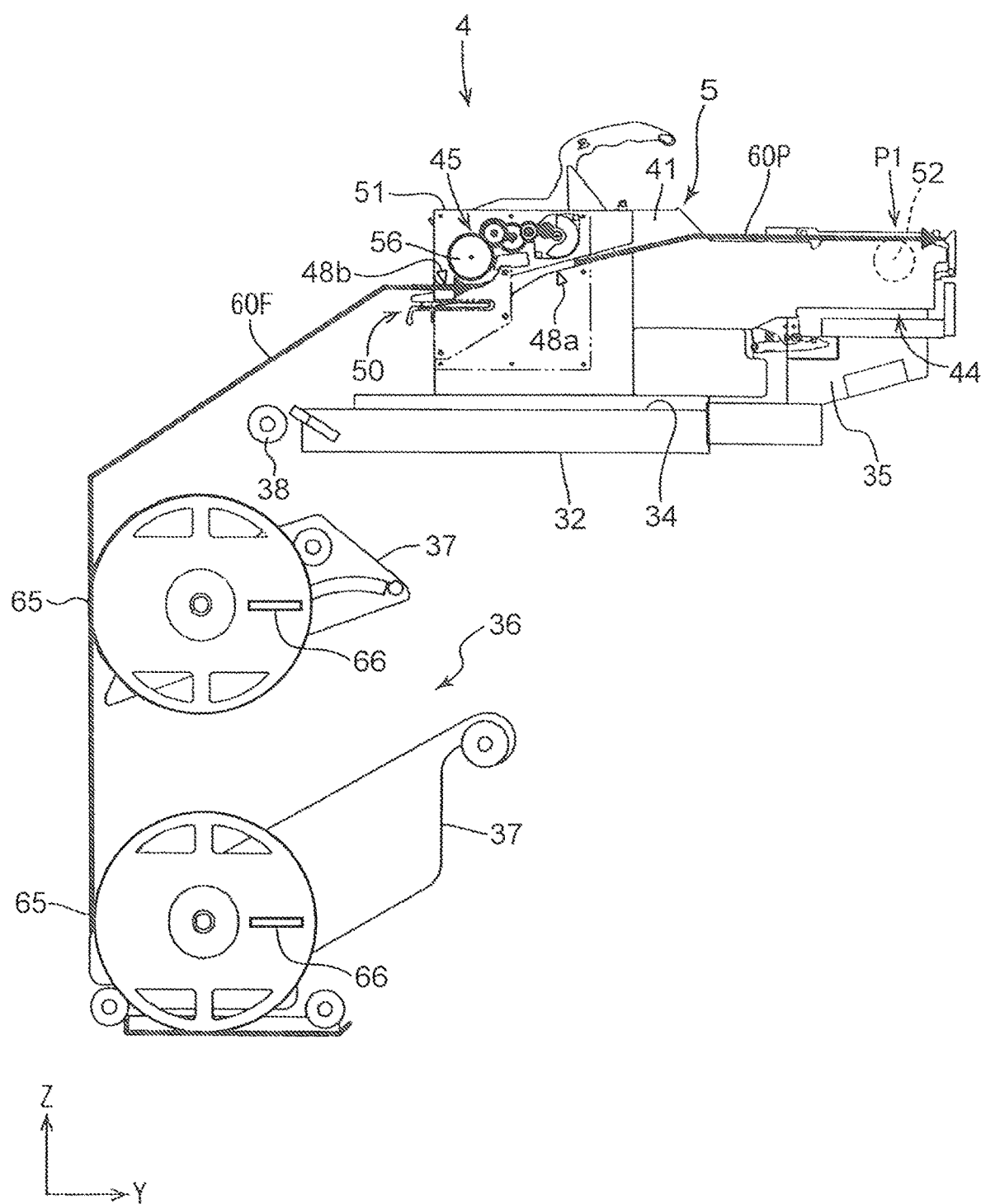
FIG. 8 is an explanatory view of the method of mounting a succeeding tape.

Assume a case where, in a part mounting operation, the preceding part supply tape 60P is entirely reeled out from the reel 65 and, as shown in FIG. 8, a tail end of the preceding part supply tape 60P passes the position of the first tape detection sensor 48a, and the absence of the preceding part supply tape 60P is detected. In this case, the rear side motor 57 is driven by the feeder control part 49 so that the succeeding part supply tape 60F is loaded to the part supply position P1. That is, the rear side sprocket 56 is rotated, and along with such rotation of the rear side sprocket 56, the succeeding part supply tape 60F is fed to the position where the part supply tape 60F engages with the front side sprocket 52. With such an operation, the transfer from the preceding part supply tape 60P to the succeeding part supply tape 60F is automatically performed.

After such operations are completed, the reel 65 is removed from the reel holder 37 at an upper stage, and using the current part supply tape 60F as the preceding part supply tape 60P, the succeeding part supply tape 60F is mounted on the tape feeder 5 in accordance with the steps described above. Accordingly, the supply of parts by the tape feeder 5 can be successively and continuously performed.

[Control System of Part Mounting Device 1]

Next, a control system of the part mounting device 1 is described with reference to a block diagram shown in FIG. 9.

Figure 9:
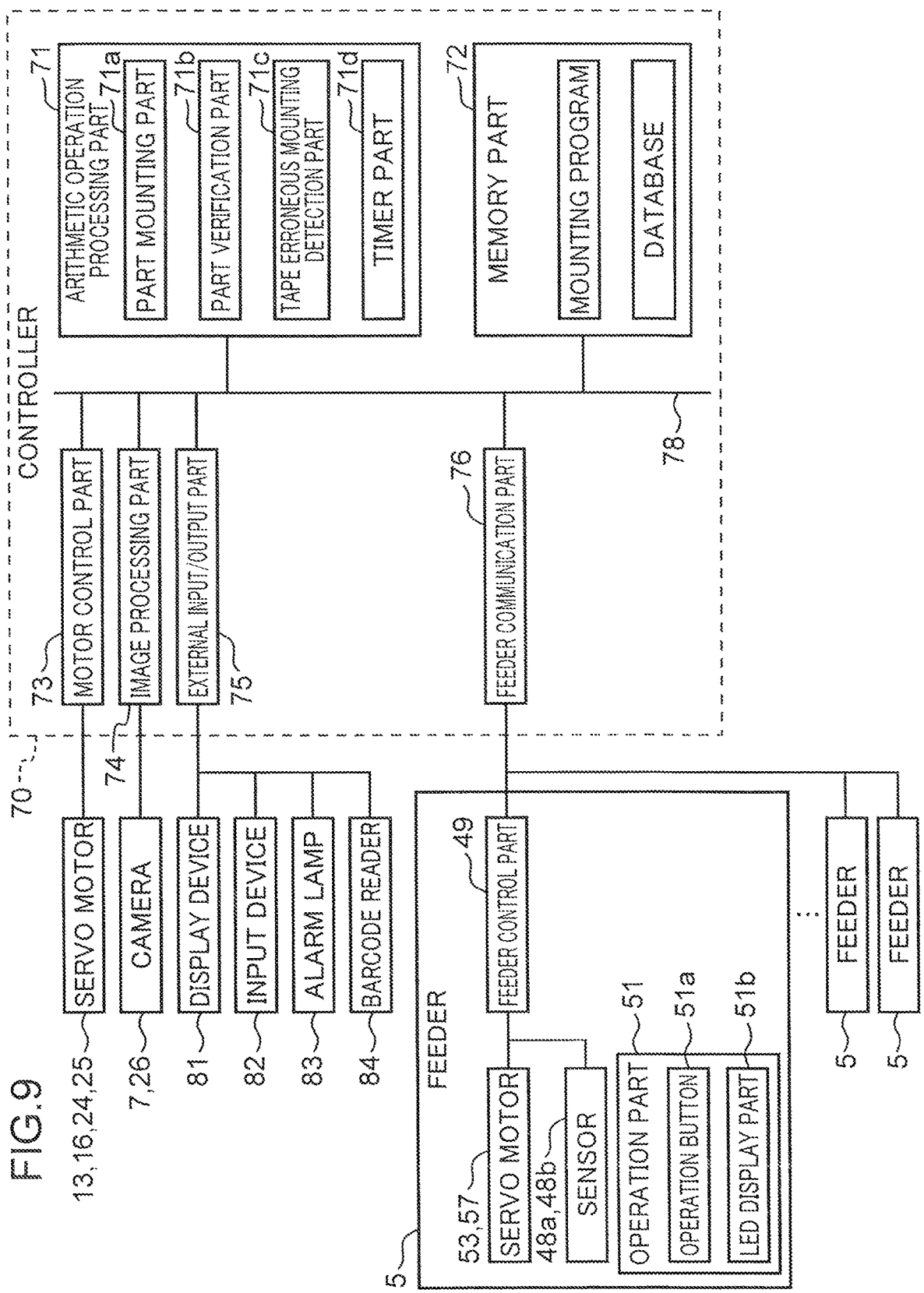
FIG. 9 is a block diagram showing the configuration of a control system of the part mounting device.

The part mounting device 1 includes the controller 70 as shown in FIG. 9. The controller 70 includes: an arithmetic operation processing part 71 which integrally controls an operation of the part mounting device 1; a memory part 72 in which a mounting program and the like are stored; a motor control part 73 which controls driving of the respective servo motors 13, 16, 24, and 25 about X, Y, Z, and R axes; an image processing part 74 which applies predetermined processing to image data output from the part recognition cameras 7 and the substrate recognition camera 26; an external input/output part 75; and a feeder communication part 76.

The arithmetic operation processing part 71 is a computer formed of a CPU and a memory, and is connected to the memory part 72, the motor control part 73, the image processing part 74, the external input/output part 75 and the feeder communication part 76 via a bus 78.

The arithmetic operation processing part 71 includes a part mounting part 71a, a part verification part 71b, a tape erroneous mounting detection part 71c, and a timer part 71d. The part mounting part 71a performs predetermined part mounting processing, and performs various arithmetic operation processing associated with the part mounting processing. The part verification part 71b performs predetermined part verification processing when a part ID (identification information of a part) is read using the barcode reader 84 described later. The tape erroneous mounting detection part 71c performs tape monitoring processing where the tape erroneous mounting detection part 71c monitors whether or not the part supply tape 60 is mounted on the tape feeder 5 and, when erroneous mounting of the part supply tape 60 occurs, detects and notifies the occurrence of erroneous mounting. The timer part 71d counts a predetermined set time in the above-mentioned part verification processing. Part verification processing and tape monitoring processing are described in detail later.

The memory part 72 stores respective databases which record a mounting program and data necessary for executing the mounting program. The databases also store various data necessary for the above-mentioned part verification processing. Specifically, as conceptually described in FIG. 10, the databases stores part verification data (corresponding to "part verification information" of the present disclosure) which make the set positions (set position information) of the respective tape feeders 5 in the part supply unit 4, that is, the positions of the slots 34 in the feeder mounting part 32 and identification information (part ID) of the parts disposed at the positions correlate with each other. Slot numbers which differ from each other are allocated to the respective slots 34, and the position of the respective slots 34, that is, the set positions of the tape feeder 5 are identified by these slot numbers. Part verification data also includes information on names, kinds, manufacturing lots of parts corresponding to part ID. The head unit 6 is controlled such that, based on part verification data shown in FIG. 10, parts are taken out from the tape feeder 5 at the set position where the tape feeder 5 which supplies parts of desired part ID is set.

The feeder communication part 76 is a feeder dedicated interface, and all tape feeders 5 disposed in the part supply unit 4 are connected to the feeder communication part 76 via the connector on the fixing base 35.

The external input/output part 75 is an interface for equipment other than the tape feeder. The external input/output part 75 is connected with a display device 81 such as a liquid crystal display device for displaying various information, an input device 82 such as a keyboard, an alarm lamp 83 which notifies an operator of the occurrence of abnormality in the part mounting device 1 or the tape feeder 5 when such abnormality occurs, the barcode reader 84, and the like. The display device 81 corresponds to a notification part of the present disclosure.

The barcode reader 84 is provided for reading a part identification barcode 66 (see FIG. 2/corresponding to a recording part of the present disclosure) attached to the reel 65 around which the part supply tape 60 is wound. The part identification barcode 66 (hereinafter, abbreviated as barcode 66) holds therein part IDs of parts accommodated in the part supply tape 60 which is wound around the reel 65 and other various information relating to the parts by encoding the part IDs and information. The barcode 66 is attached to a side surface of the reel, for example. An operator, in setting the part supply tape 60 on the tape feeder 5, reads the barcode 66 attached to the reel 65 using the barcode reader 84.

In this embodiment, the tape erroneous mounting detection system of the present disclosure includes the second tape detection sensor 48b of the tape feeder 5, the LED display part 51b, the barcode reader 84, the arithmetic operation processing part 71 (part verification part 71b, tape erroneous mounting detection part 71c, timer part 71d), the memory part 72, and the like.

A part mounting operation of the part mounting device 1, based on a control of the arithmetic operation processing part 71 (part mounting part 71a) is performed as follows. Firstly, the head unit 6 moves on the part supply unit 4, and parts are taken out from the tape feeder 5 by the respective heads 20. Then, when the head unit 6 passes over the closest part recognition camera 7, the parts sucked by the respective heads 20 are imaged by the part recognition camera 7 so that the suction state of the parts is recognized. Then, the head unit 6 moves over the substrate P and the parts sucked by the respective heads 20 are sequentially mounted on the substrate P. At this stage of operation, the position of the head unit 6 and a rotational angle or the like of the heads 20 are controlled based on a result of part recognition so that the parts are properly mounted on respective mounting points of the substrate P. With such an operation, one cycle of the mounting operation is finished, and the desired parts are mounted on the substrate P by repeating such an operation as necessary.

[Various Processing Controls by Arithmetic Operation Processing Part 71]

The tape feeder 5 mounted on the part mounting device 1 is a tape feeder of the splicing-less method as described previously. This tape feeder 5 has an advantage that, by setting the part supply tape 60 in advance, a tape feeding operation is automatically started along with starting of a part mounting operation, and with respect to the succeeding part supply tape 60, parts can be supplied continuously without performing a tape joining operation. However, in the case where the part supply tape 60 is erroneously mounted on the tape feeder 5 which is not an object and such erroneous mounting is left, there is a concern that a defect in supplying parts or a failure is induced in the tape feeder 5, or an erroneous part is mounted on the substrate P. Accordingly, in this part mounting device 1, to avoid such troubles, when the part ID is read using the barcode reader 84, predetermined part verification processing is performed by the part verification part 71b. Further, the tape erroneous mounting detection part 71c performs tape monitoring processing where the tape erroneous mounting detection part 71c monitors whether or not the part supply tape 60 is mounted on the tape feeder 5, and when erroneous mounting of the part supply tape 60 occurs, detects and notifies the occurrence of erroneous mounting. Hereinafter, these processing are described in detail.

The arithmetic operation processing part 71, as a result of part verification processing, outputs a control signal to the feeder control part 49 so as to allow loading of the part supply tape 60 only when the tape feeder 5 (set position information of the tape feeder 5) and the part ID are compatible with each other. That is, the arithmetic operation processing part 71 inhibits loading of the part supply tape 60 when the tape feeder 5 and the part ID are not compatible with each other. Accordingly, in the case where the tape feeder 5 and the part ID are not compatible with each other, even when the part supply tape 60 is loaded on the tape feeder 5 and the operation button 51a is operated, loading of the part supply tape 60 is not performed. Further, with respect to the succeeding part supply tape 60, even in the case where the entire preceding part supply tape 60 is fed out (even when the tail end of the part supply tape 60 passes the position of the first tape detection sensor 48a and the absence of the preceding part supply tape 60 is detected), loading of the succeeding part supply tape 60 is not performed.

1. Part Verification Processing

In the description made hereinafter, for the sake of convenience of the description, the part supply tape 60 is abbreviated as "tape 60".

Figure 11:
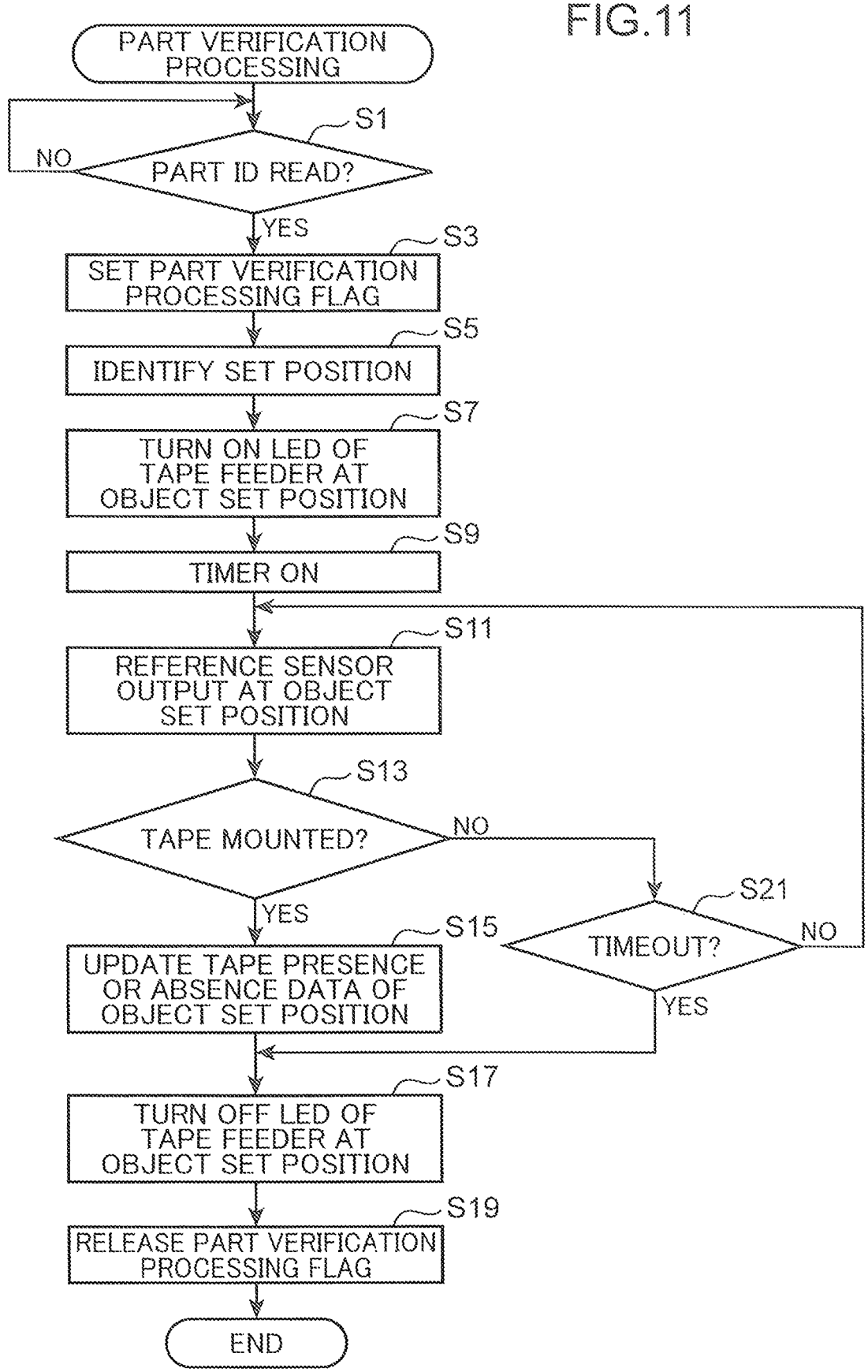
FIG. 11 is a flowchart showing part verification processing.

FIG. 11 is a flowchart showing part verification processing.

Part verification processing substantially starts by reading the barcode 66 (part ID) of the reel 65 using the barcode reader 84. That is, in mounting the tape 60 on the tape feeder 5, an operator performs a reading operation of the barcode 66 using the barcode reader 84. Accordingly, the part verification part 71b waits reading of the part ID (step S1), and sets a part verification processing flag when the part ID is read (step S3)

Next, the part verification part 71b, based on the read part ID and the part verification data of the database (see FIG. 10), identifies the set position of the tape feeder 5 at which the part corresponding to the part ID is to be mounted, that is, the slot number. The part verification part 71b also outputs a control signal to the tape feeder 5 set at the set position (hereinafter referred to as object set position). Such tape feeder 5 is referred to as the object feeder 5. With such an operation, the LED display part 51b of the object feeder 5 is turned on (or is flickered) (steps S5, S7) and, thereafter, the timer part 71d is operated (step S9). By turning on the LED display part 51b of the object feeder 5 in this manner, an operator can easily identify the object feeder 5.

The timer part 71d counts a predetermined set time. This set time is set to a time (approximately 30 seconds) within which, after the LED display part 51b is turned on, an operator mounts the tape 60 on the tape feeder 5, and can immediately remount the mounted tape 60 on the tape feeder 5 one time or plural times.

Next, the part verification part 71b references an output signal from the second tape detection sensor 48b of the object feeder 5 (step S11), and determines whether or not the tape 60 is mounted on the object feeder 5 (step S13). In this embodiment, for example, a signal from the second tape detection sensor 48b is output to the controller 70 via the feeder control part 49. In such an operation, a signal of level "0" is output to the controller 70 when the tape 60 is not present, and a signal of level "1" is output to the controller 70 when the tape 60 is present. Accordingly, the part verification part 71b determines whether or not the tape 60 is mounted based on such a signal level.

If the determination result is Yes in step S13, the part verification part 71b changes data of the tape 60 at the object set position from "absence" to "presence" with respect to tape presence or absence data (corresponding to "tape presence or absence information" of the present disclosure), and stores the tape presence or absence data in an updated manner (step S15). Tape presence or absence data is data indicative of the presence or the absence of the tape 60 at respective set positions, and the tape presence or absence data is stored in the above-mentioned database in an updated manner.

When the determination result is Yes in step S13, it is confirmed by the part verification part 71b that part verification is correctly performed. That is, the part verification part 71b confirms that the tape 60 which supplies parts having desired part ID are set at the correct set positions. The part verification part 71b stores this information in the memory part 72, and performs loading of the tape 60 when a command of loading the tape 60 is generated in response to the detection of a part running out of the preceding tape 60 or an operation of the operation button 51a.

Then, the part verification part 71b turns off the LED display part 51b by outputting a control signal to the object feeder 5, and finishes the part verification processing after releasing the part verification processing flag (steps S17, S19).

On the other hand, if the determination result is No in step S13, that is, the determination is made that the tape 60 is not mounted on the object feeder 5, the part verification part 71b determines whether or not the operation is timed out, that is, whether or not counting of the above-mentioned set time by the timer part 71d is completed (step S21). If the determination result is No in step S21, the part verification part 71b advances processing to step S11, while if the determination result is Yes, the part verification part 71b advances processing to step S17.

That is, in the case where the tape 60 is mounted on the object feeder 5 within the above-mentioned set time, the part verification part 71b updates tape presence or absence data of the object set position and, thereafter, releases part verification processing flag. On the other hand, in the case where the tape 60 is not mounted on the object feeder 5 within the above-mentioned set time, the part verification part 71b releases the part verification processing flag without updating tape presence or absence data at the object set position.

In this embodiment, processing in steps S11 to S15 in part verification processing mainly corresponds to "verification updating processing" of the present disclosure.

2. Tape Monitoring Processing

Figure 12:
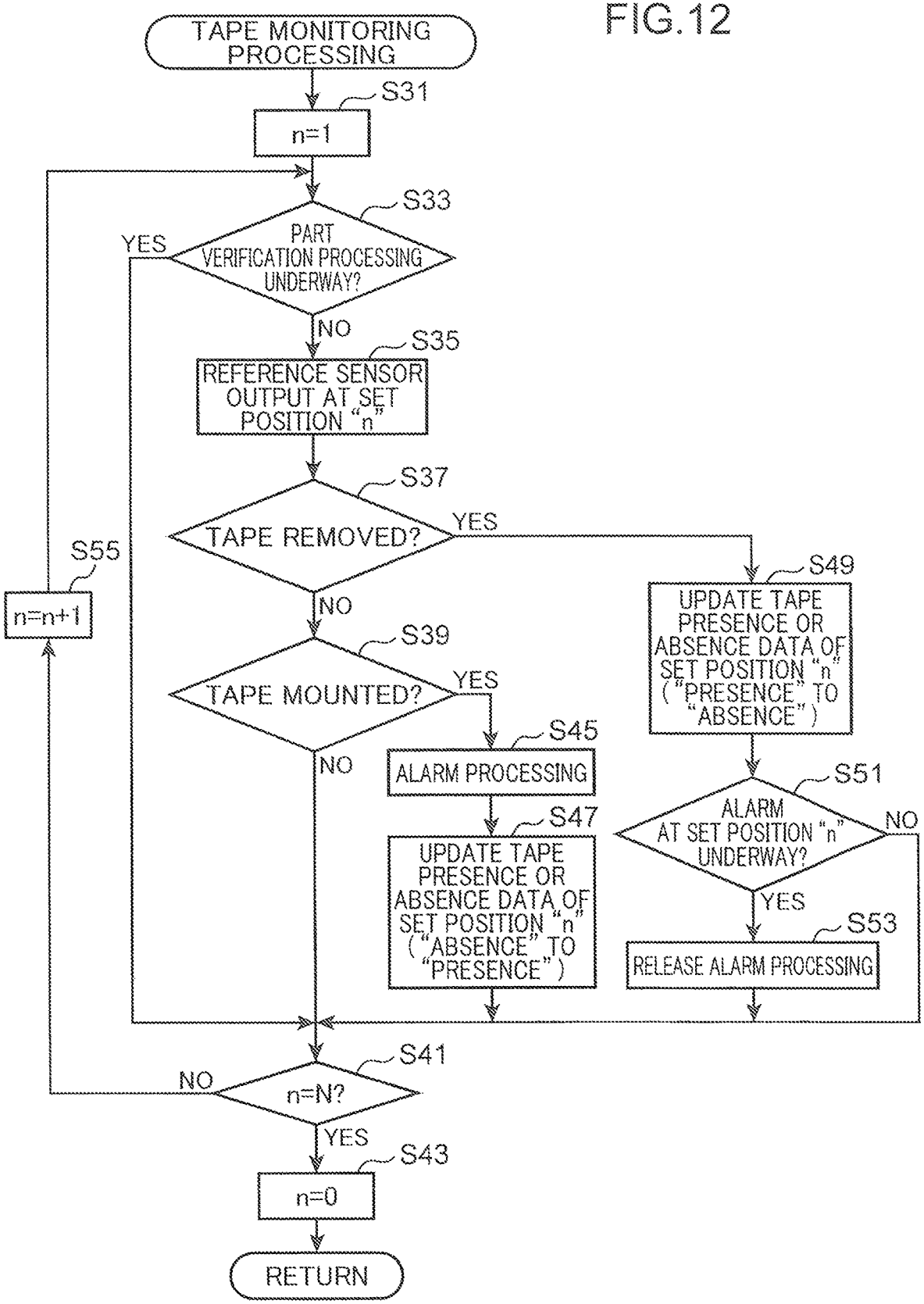
FIG. 12 is a flowchart showing tape monitoring processing.

FIG. 12 is a flowchart showing tape monitoring processing.

While the above-mentioned part verification processing is substantially performed by reading the barcode 66 using the barcode reader 84, tape monitoring processing is successively continued from a point of time that the part mounting device 1 is started, for example.

When tape monitoring processing starts, the tape erroneous mounting detection part 71c sets an initial value "1" in a counter value of the set position counter (step S31), and determines whether or not part verification processing is underway, that is, part verification processing flag (step S3 in FIG. 11) is set with respect to anyone of tape feeders 5 (step S33).

If the determination result is No in step S33, the tape erroneous mounting detection part 71c references an output signal of the second tape detection sensor 48b at the set position corresponding to a counter value "n", that is, an output signal of the second tape detection sensor 48b of the tape feeder 5 set in the slot 34 of a slot number "n" (step S35), and the tape erroneous mounting detection part 71c determines whether or not the tape 60 is removed from the tape feeder 5 (step S37). Specifically, the tape erroneous mounting detection part 71c determines the presence or absence of the tape 60 based on a signal level from the second tape detection sensor 48b, and determines whether or not the tape 60 is removed based on the result and tape presence or absence data. That is, with respect to tape presence or absence data, when data at the set position "n" is "presence" and a signal level from the second tape detection sensor 48b is "0", the tape erroneous mounting detection part 71c determines that the tape 60 is removed. Accordingly, the tape erroneous mounting detection part 71c also determines that the tape 60 is removed not only in the case where the tape 60 is made to pass through (passes through) the upper side path 46a but also in the case where the preceding tape 60P is transferred from the upper side path 46a to the lower side path 46b due to insertion and removal of the support member 50 so that the signal level from the second tape detection sensor 48b becomes "0".

If the determination result is Yes in step S37, with respect to tape presence or absence data, the tape erroneous mounting detection part 71c changes data at the set position "n" from "presence" to "absence", and stores the tape presence or absence data in an updated manner (step S49). Further, the tape erroneous mounting detection part 71c determines whether or not alarm processing described later is performed or not with respect to the tape feeder 5 at the set position "n" (step S51), stops the alarm processing when the tape erroneous mounting detection part 71c determines that the alarm processing is performed (step S53) and, thereafter, the tape erroneous mounting detection part 71c advances processing to step S41.

On the other hand, if the determination result is No in step S37, the tape erroneous mounting detection part 71c determines whether or not the tape 60 is mounted on the tape feeder 5 at the set position "n" (step S39). Specifically, in the case where data at the set position "n" is "absence" and a signal level from the second tape detection sensor 48b is "1" with respect to tape presence or absence data, the tape erroneous mounting detection part 71c determines that the tape 60 is mounted.

If the determination result is No in step S39, the tape erroneous mounting detection part 71c advances processing to step S41. On the other hand, if the determination result is Yes in step S39, the tape erroneous mounting detection part 71c performs alarm processing assuming that erroneous mounting of the tape 60 occurs (step S45). For example, the tape erroneous mounting detection part 71c outputs a control signal so as to make the display device 81 display the occurrence of erroneous mounting of the tape 60 and the set position "n" of the tape 60, and operates the alarm lamp 83. The tape erroneous mounting detection part 71c also outputs a control signal to the tape feeder 5 set at the set position "n" thus turning on (or flickering) the LED display part 51b. With such processing, the tape erroneous mounting detection part 71c notifies an operator of the set position and the tape feeder 5 each corresponding to a fact that erroneous mounting occurs on the tape 60. Then, the tape erroneous mounting detection part 71c changes data of the tape 60 at the set position "n" from "absence" to "presence" with respect to tape presence or absence data, and stores the tape presence or absence data in an updated manner (step S47), and advances processing to step S41.

Processing in steps S35 to S39 and processing in steps S45 to S49 are performed if the determination result is No in step S33. That is, the processing in steps S35 to S39 and the processing in steps S45 to S49 are performed during a period which differs from the period during which part verification processing is performed. Accordingly, in the case where the tape 60 is mounted on the object feeder 5 without reading of the barcode 66 using the barcode reader 84, that is, in the case where the tape 60 is mounted on the object feeder 5 without performing part verification processing or in the case where the tape 60 is mounted on the tape feeder 5 which is not an object, determination result is Yes in step S39 and these tapes 60 are all detected as being erroneously mounted and become a subject of alarm processing.

If the determination result is Yes in step S33, that is, in the case where part verification processing is underway with respect to any one of tape feeders 5, the tape erroneous mounting detection part 71c skips the processing in steps S35 to S39 and the processing in steps S45 to S49, and advances processing to step S41.

In step S41, the tape erroneous mounting detection part 71c determines whether or not a counter value of the set position counter is equal to a total number N of the set positions. If the determination result is No in step S41, the tape erroneous mounting detection part 71c increments the counter value by "1", and advances processing to step S33 (step S55). On the other hand, If the determination result is Yes in step S41, the tape erroneous mounting detection part 71c resets the counter value to "0" (step S43), and the tape erroneous mounting detection part 71c returns processing to step S1.

In this manner, during the period which differs from the period during which part verification processing is performed, the tape erroneous mounting detection part 71c, based on a signal output from the second tape detection sensor 48b, detects the presence or the absence of the tape 60 in the respective tape feeders 5 and updates tape presence or absence data at the respective set positions. Meanwhile, when the set position at which the tape 60 changes from "absence" to "presence" occurs, the detection is made where the occurrence of erroneous mounting of the tape 60 is assumed, and alarm processing is performed. That is, in this embodiment, the above-mentioned tape monitoring processing performed during the period which differs from the period where the part verification processing is performed corresponds to "erroneous mounting detection processing" of the present disclosure.

[Functions and Effects]

In the part mounting device 1, in the case of mounting the tape 60 on any one of tape feeders 5, it is necessary for an operator to read the barcode 66 attached to the reel 65 using the barcode reader 84, and to make the arithmetic operation processing part 71 read the part ID.

When the operator properly performs reading of the barcode 66, the LED display part 51b of the object feeder 5 on which the tape 60 is expected to be mounted is turned on (step S7 in FIG. 11). Accordingly, the operator can speedily mount the tape 60 on the object feeder 5 using lighting of the LED display part 51b as a key.

Then, when the tape 60 is properly mounted on the object feeder 5, with respect to tape presence or absence data, data of the object set position is updated, and the LED display part 51b is turned off (steps S13 to S17 in FIG. 11). Accordingly, the operator can recognize that the tape 60 is mounted on the object feeder 5.

On the other hand, when an operator mounts the tape 60 on the tape feeder 5 without reading the barcode 66 (hereinafter referred to as a first instance), or in the case where although the operator reads the barcode 66, the operator is not aware of that the tape 60 is mounted on the tape feeder 5 which is not an object and such a situation is left (hereinafter referred to as a second instance), alarm processing is performed (step S45 in FIG. 12)

The reason is as follows in the case of the first instance. Reading of the barcode 66 is not performed (No in step S1 in FIG. 11) and hence, a part verification processing flag is not set whereby part verification processing is not performed. Accordingly, in tape monitoring processing, it is determined that the tape 60 is mounted on the tape feeder 5 during the period which differs from the period during which part verification processing is performed (Yes in step S39 in FIG. 12). As a result, alarm processing is performed. In this case, alarm processing is performed regardless of whether or not a relationship between the tape 60 and the tape feeder 5 (set position) on which the tape 60 is mounted is correct.

On the other hand, the reason is as follows in the case of the second instance. The tape 60 is erroneously mounted on the tape feeder 5 other than the object feeder 5 and such a situation is left and hence, tape presence or absence data is not updated in part verification processing. That is, with respect to the tape presence or absence data, an operation is timed out in a state where data of the object set position is being "absence" (Yes in step S21 in FIG. 11). As a result, in the same manner as the first instance, in tape monitoring processing, it is determined that the tape 60 is mounted on the tape feeder 5 during the period which differs from the period during which part verification processing is performed (Yes in step S39 in FIG. 12). As a result, alarm processing is performed.

In this manner, according to the part mounting device 1, even when the erroneous operation described in the first instance or the erroneous mounting of the tape 60 described in the second instance occurs, such a state can be detected. Accordingly, it is possible to suppress the occurrence of a trouble such as a defect in supplying parts to the tape feeder 5 attributed to the reason that such a situation is left.

When alarm processing is performed, an operator may temporarily remove the tape 60 from the tape feeder 5, and may remount the tape 60 on the tape feeder 5 in accordance with proper steps. That is, the operator may read the barcode 66 using the barcode reader 84 and, thereafter, may remount the tape 60 on the object feeder 5. When the tape 60 is temporarily removed, lighting (flickering) of the alarm lamp 83 and the LED display part 51b is stopped. With respect to tape presence or absence data, data on the corresponding set position is changed from "presence" to "absence" (steps S37 and S49 to S53 in FIG. 12) and hence, succeeding part verification processing is performed without any trouble.

In the part verification processing, even when the tape 60 is mounted on the tape feeder 5 which is not an object, a part verification processing flag is not released until a set time is counted by the timer part 71d (steps S13, S21 in FIG. 11). Accordingly, the part verification processing also has an advantageous effect that it is possible to avoid cumbersomeness brought about by the case where a situation in which an operator inadvertently erroneously mounts the tape 60 and the operator instantaneously finds such erroneous mounting is also detected as erroneous mounting.

That is, the case is considered where alarm processing is immediately performed at a point of time that the tape 60 is erroneously mounted on the tape feeder 5, in this case, however, even when an operator immediately finds erroneous mounting and can remount the tape 60 correctly, alarm processing is performed and such alarm processing is extremely cumbersome.

In this respect, according to the above-mentioned part mounting device 1, when the tape 60 is set on the object feeder 5 until counting of a set time by the timer part 71d is completed after turning on the LED display part 51b of the object feeder 5, tape presence or absence data is updated. Accordingly, even in the case where the tape 60 is erroneously mounted on the tape feeder 5 which is not an object, alarm processing is not performed when an operator remounts the tape 60 within the above-mentioned set time. In this manner, according to this part mounting device 1, it is possible to eliminate the above-mentioned cumbersomeness while properly detecting erroneous mounting of the tape 60.

Particularly, the above-mentioned set time is set to a time (approximately 30 seconds) within which an operator mounts the tape 60 on the tape feeder 5 and can immediately remount the mounted tape 60 one time or plural times. Accordingly, it is possible to have an advantageous effect that even when the tape 60 is erroneously mounted, the operator can have enough time to accurately and surely remount the tape 60.

Further, according to the above-mentioned part mounting device 1, part verification is performed only with respect to a relationship with the tape feeder 5 on which the tape 60 whose part ID is already read is to be mounted. Accordingly, it is possible to acquire an advantageous effect that a reaction of part verification is fast when the tape 60 is properly mounted on the tape feeder 5 and hence, the tape 60 can be loaded more speedily.

[Modification of Part Verification Processing]

Next, a modification of part verification processing is described.

Figure 13:
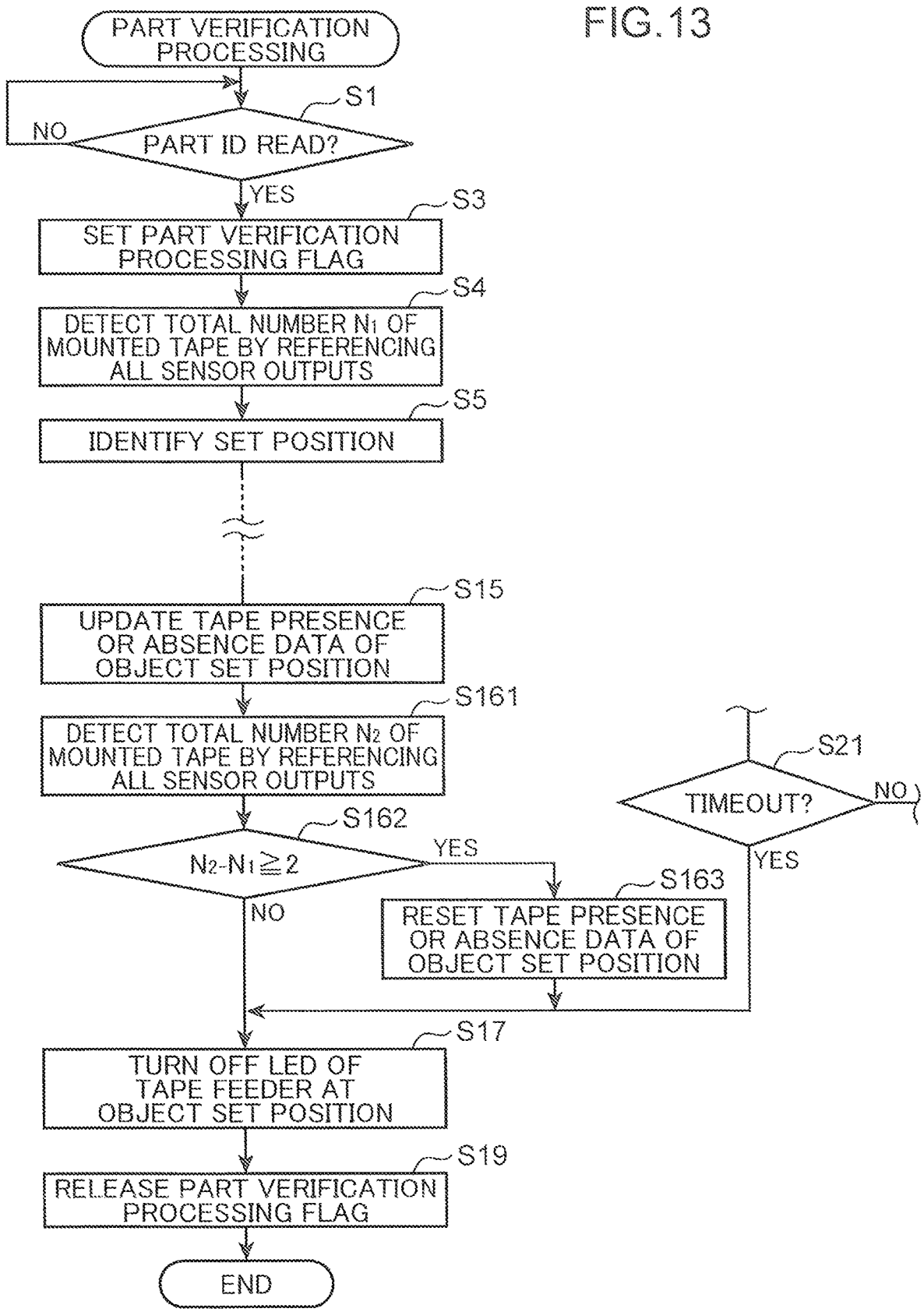
FIG. 13 is a flowchart showing a modification of part verification processing.

FIG. 13 is a flowchart showing a modification of part verification processing. Part verification processing shown in FIG. 13 is provided for solving one of tasks of part verification processing shown in FIG. 11.

Specifically, part verification processing shown in FIG. 13 is provided for solving the drawback that in the case where the tape 60 in which a part ID (barcode 66) is read is mounted on the tape feeder 5 and, thereafter, one or a plurality of tapes 60 are continuously mounted in a state where a part ID is not read before a timeout, there is a concern that erroneous mounting of the tape 60 is missed. This drawback is described more specifically hereinafter with reference to FIG. 14 to FIG. 16.

Figure 14:
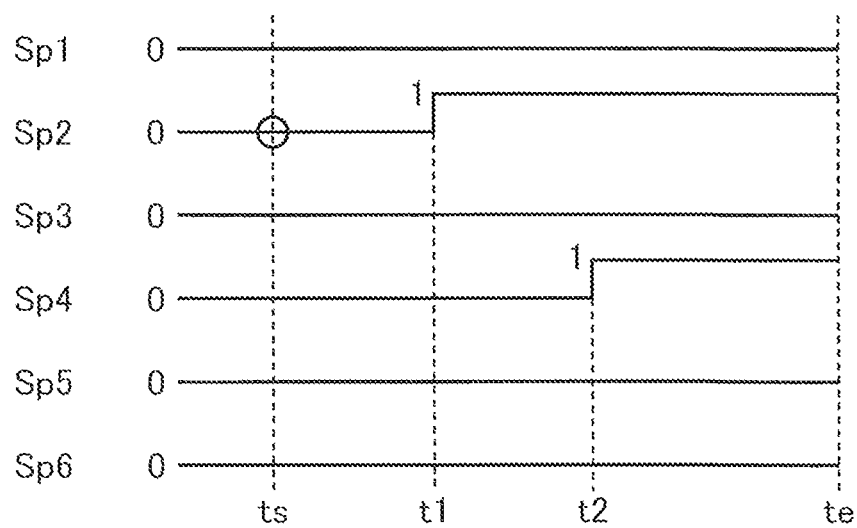
FIG. 14 is a timing chart showing outputs of tape detection sensors.
Figure 15:
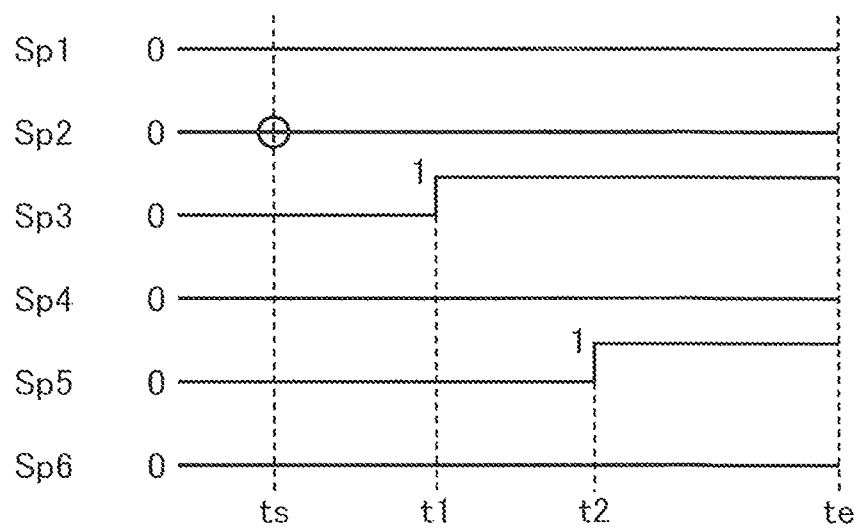
FIG. 15 is a timing chart showing outputs of the tape detection sensors.
Figure 16:
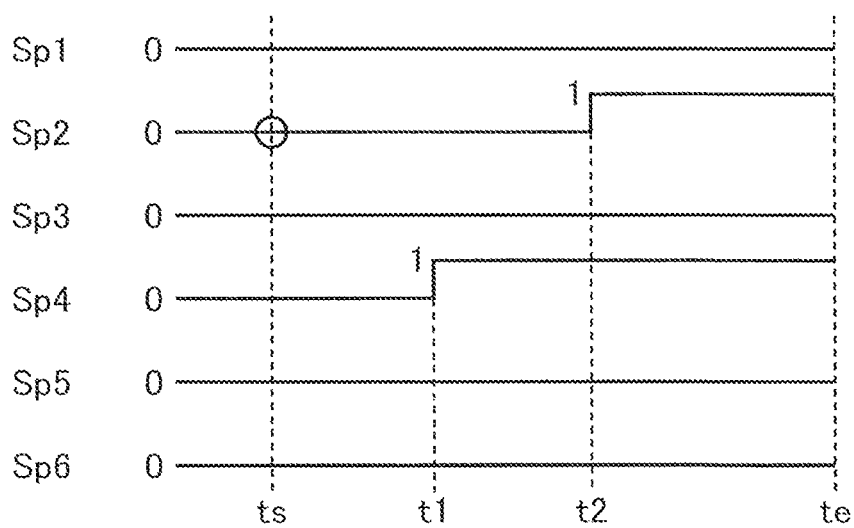
FIG. 16 is a timing chart showing outputs of the tape detection sensors.

FIG. 14 to FIG. 16 are timing charts showing output signals from the second tape detection sensor 48b of the respective tape feeders 5 set at the set positions "Sp1" to "Sp6". A point of time is is a point of time at which an object set position is identified based on a part ID of the tape 60 (at step S5 in FIG. 11). The point of time t1 is a point of time that the first tape 60, that is, the tape 60 in which the part ID is read is mounted. The point of time t2 is a point of time that the second tape 60, that is, the tape 60 in which the part ID is not read is mounted. A point of time to is a point of time of timeout (Yes in step S21 shown in FIG. 11). In all examples shown in FIG. 14 to FIG. 16, assume an object set position as "Sp2" (indicated by a circle mark in the drawing).

In the example shown in FIG. 14, the tape 60 in which the part ID is read (hereinafter referred to as "object tape 60") is mounted on the object feeder 5 and, thereafter, another tape 60 is set on the tape feeder 5 at the set position "Sp4".

In the example shown in FIG. 14, the object tape 60 is mounted on the object feeder 5 and hence, at this point of time, a part verification processing flag is released (steps S15 to S19 in FIG. 11). Accordingly, the second tape 60 is detected as a tape which is mounted on the tape feeder 5 during a period which differs from the period during which part verification processing is performed, that is, as a tape which is erroneously mounted, and alarm processing is performed (steps S39, S45 in FIG. 12). Accordingly, the case shown in FIG. 14 has no particular problem.

In the example shown in FIG. 15, the object tape 60 is mounted on the tape feeder 5 which is not an object (the tape feeder 5 at the set position "Sp3") and, thereafter, the second tape 60 is mounted on the tape feeder 5 at the set position "Sp5".

In the example shown in FIG. 15, the object tape 60 is not mounted on the object feeder 5 and hence, timeout comes in a state where tape presence or absence data is not updated (Yes in step S21 in FIG. 11). Accordingly, both the tape 60 mounted on the tape feeder 5 at the set position "Sp3" and the tape 60 mounted on the tape feeder 5 at the set position "Sp5" are subjected to alarm processing as the tape which is erroneously mounted during the period which differs from the period during which part verification processing is performed (steps S39, S45 in FIG. 12). Accordingly, the case shown in FIG. 15 has no particular problem.

On the other hand, in the example shown in FIG. 16, the object tape 60 is mounted on the tape feeder 5 which is not an object (the tape feeder 5 at the set position "Sp4") and, thereafter, the second tape 60 is mounted on the tape feeder 5 at the set position "Sp2", that is, the object feeder 5 to which the object tape 60 which is mounted previously is to be mounted before timeout.

In part verification processing, the part verification part 71b determines whether or not the object tape 60 is mounted simply based on a signal level of the second tape detection sensor 48b of the object feeder 5. Accordingly, in the case of the example shown in FIG. 16, the part verification part 71b determines that the object tape 60 is mounted on the object feeder 5 at a point of time t2 (steps S11 to S15 in FIG. 11). Accordingly, there arises a state where although erroneous mounting at the set position "Sp4" is detected, with respect to the set position "Sp2", erroneous mounting is not detected in spite of the fact that the object tape 60 is not mounted.

In this manner, part verification processing shown in FIG. 11 has a drawback that erroneous mounting of the tape 60 in the example shown in FIG. 16 is missed.

Part verification processing described in a flowchart shown in FIG. 13 can overcome the drawback of the part verification processing shown in FIG. 11.

The flowchart shown in FIG. 13 is a flowchart where processing in step S4 is added to the flowchart of part verification processing shown in FIG. 11 and processing in steps S161 to S163 is added between step S15 and step S17. Accordingly, in FIG. 13, with respect to steps which are substantially equal to steps adopted in part verification processing in FIG. 11, the description of most of such steps is omitted, and only an essential part of the steps is described.

In part verification processing shown in FIG. 13, part verification part 71b sets a part verification processing flag (step S3) and, thereafter, detects the total number of $N_1$ of the tapes 60 by referencing output signals from the second tape detection sensors 48b of all tape feeders 5 (step S4).

After updating tape presence or absence data (step S15), part verification part 71b again detects the total number of $N_2$ of the tapes 60 by referencing output signals from the second tape detection sensors 48b of all tape feeders 5 (step S161).

Then, the part verification part 71b determines whether or not the difference between the total number $N_2$ detected in step S161 and the total number $N_1$ detected in step S4 is 2 or more. If the determination result is No, the part verification part 71b advances processing to step S17, while if the determination result is Yes, the part verification part 71b resets the tape presence or absence data updated in step S15 to data before updating, and advances processing to step S17.

That is, even in the case where the tapes 60 are mounted on the object feeders 5 (Yes in step S13), when the total numbers of the mounted tapes 60 are increased by 2 or more, it is considered that the state of the example shown in FIG. 16 occurs.

Accordingly, when the total numbers of the mounted tapes 60 are increased by 2 or more, the tape presence or absence data which is once updated is reset to the data before updating (steps S162, S163). When the tape presence or absence data is reset to the data before updating, the tapes 60 mounted during part verification processing are all detected as erroneous mounting in tape monitoring processing and are subjected to alarm processing (steps S39, S45 in FIG. 11). Accordingly, by making use of this detection, the respective tapes 60 are remounted by an operator so that it is possible to suppress missing of erroneous mounting of the tape 60 in the example shown in FIG. 16.

In this embodiment, processing in step S4 corresponds to "first detection processing" of the present disclosure, processing in step S161 corresponds to "second detection processing" of the present disclosure, and processing in steps S162, S163 corresponds to "reset processing" of the present disclosure.

[Other Modifications]

The description has been made with respect to the part mounting device 1 to which the present disclosure is applied heretofore. However, the specific configuration of the present disclosure is not limited to the configuration of the above-mentioned embodiment, and the configuration of the present disclosure can appropriately be modified without departing from the gist of the present disclosure. For example, the present disclosure is also applicable to the following configurations.

Figure 17:
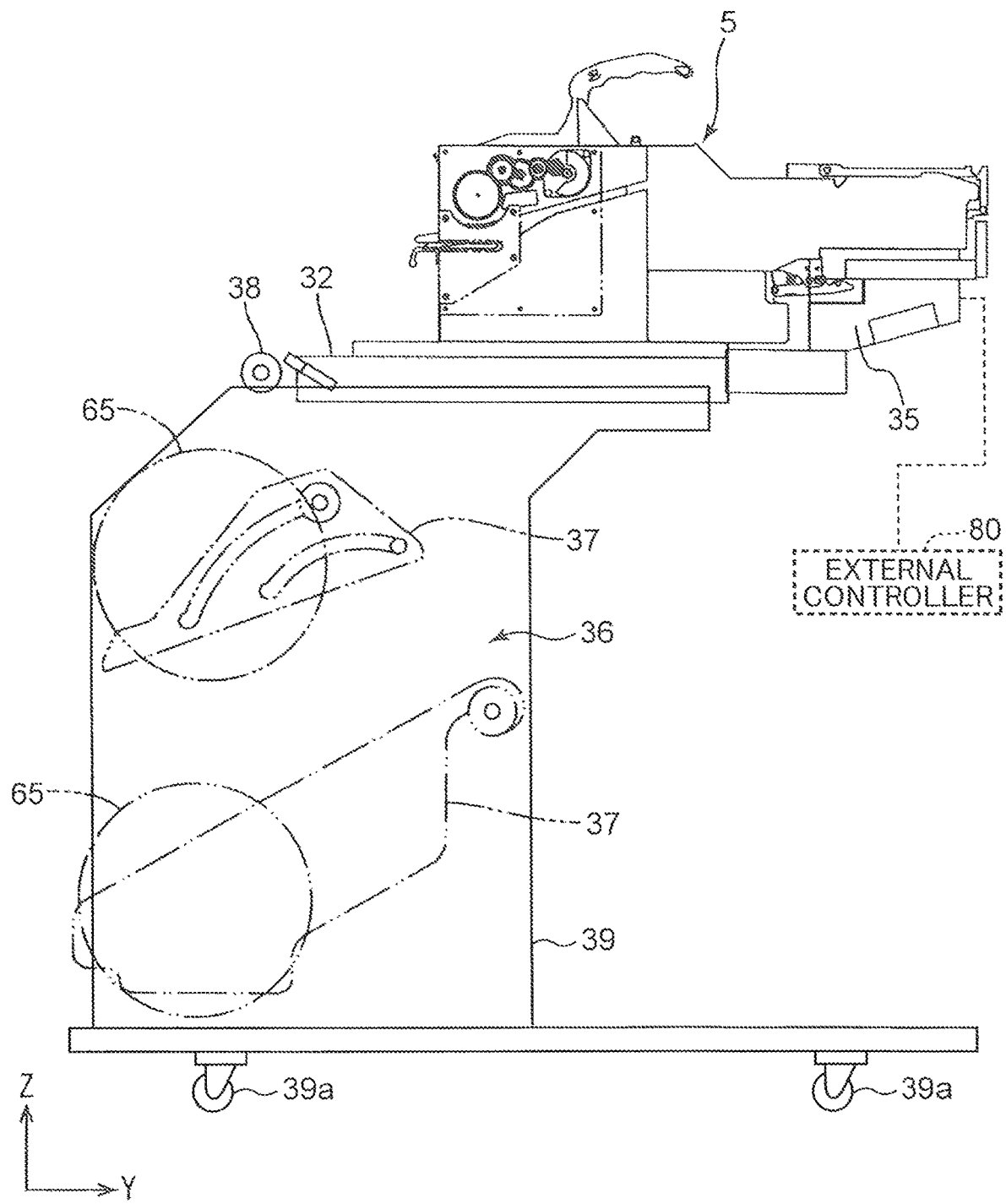
FIG. 17 is a schematic view showing a modification of the part supply unit as viewed from a side.

(1) In the above-mentioned embodiment, the part supply unit 4 is integrally (non-detachably) incorporated in the part mounting device 1. However, the part supply unit 4 may be detachably merged with the device body of the part mounting device 1. Specifically, as shown in FIG. 17, the part supply unit 4 may include: the feeder mounting part 32; the fixing base 35; a unit frame 39 having the reel support portion 36 and the guide roller 38; and a plurality of casters 39a which movably support the unit frame 39, and the part supply unit 4 may be detachably configured with respect to the device body of the part mounting device 1 which includes the head unit 6 and the like. With such a configuration, the part supply unit 4 on which the tape feeder 5 is mounted as a preparation step is prepared in advance at a site away from the device body, and this part supply unit 4 is exchanged with the part supply unit 4 which is set on the device body previously and hence, a plurality of tape feeders 5 (parts) can be collectively exchanged. Accordingly, it is possible to acquire an advantageous effect that the part mounting device can quickly cope with changing of a type of a substrate to be manufactured.

In this case, an external controller 80 (see FIG. 17) and a barcode reader (not shown) which is capable of communicating with the external controller 80 are prepared in advance. The external controller 80 is a personal computer or the like in which programs for executing the above-mentioned part verification processing and the above-mentioned tape monitoring processing and a database are stored, and includes functional parts such as the above-mentioned part verification part 71b, the tape erroneous mounting detection part 71c, the timer part 71d and the like. In mounting the tape feeder 5 on the part supply unit 4 as a preparation step, the external controller 80 is communicably connected to the part supply unit 4 so that the part verification processing and the tape monitoring processing can be performed by the external controller 80. With such a configuration, even at a site away from the device body, the part verification processing and the tape monitoring processing can be performed and hence, in the same manner as the above-mentioned embodiment, alarm processing can be performed by properly detecting erroneous mounting of the tape 60.

In the case where a personal computer is used as the external controller 80, in place of the above-mentioned alarm lamp 83 or the display device 81, a fact that erroneous mounting of the tape 60 occurs, and the set position and the tape feeder 5 corresponding to the fact may be notified through a display screen.

Figure 18:
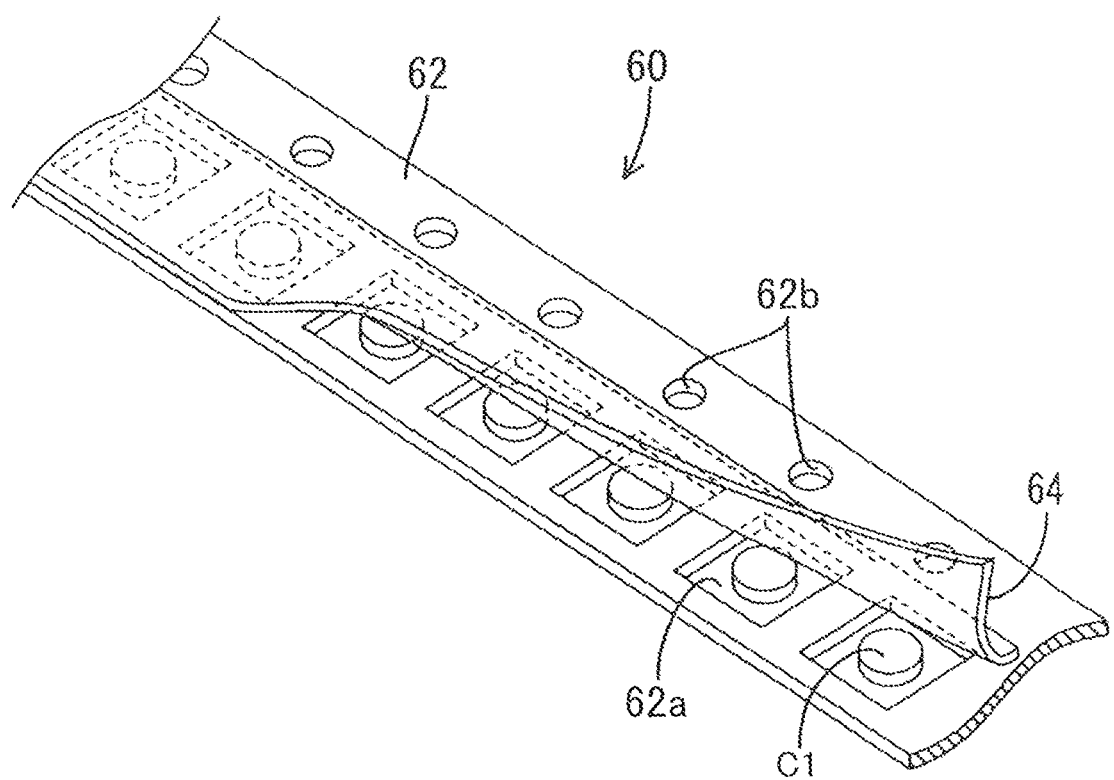
FIG. 18 is a perspective view of the part supply tape showing a modification of a cutting pattern of a cover tape.

(2) In the above-mentioned embodiment, as shown in FIG. 4, in the above-mentioned tape feeder 5, the parts C1 are exposed to the outside by cutting the cover tape 64 at the center in the width direction along the longitudinal direction and by folding the cover tape 64 to the outside. However, as shown in FIG. 18, a tape feeder 5 may be configured such that one end of the cover tape 64 in the width direction is peeled off along the longitudinal direction, and such one end of the cover tape 64 is folded toward the other end in the width direction. Further, a tape feeder 5 may be of a type where a cover tape 64 is wound while being peeled off from a tape body 62. Various types of tape feeders are applicable as the tape feeder 5.

(3) In the above-mentioned embodiment, the barcode 66 is mounted on the reel 65 as the recording part which records a part ID (identification information of a part). However, two dimensional code such as a QR code (registered trademark) besides the barcode 66, an IC chip or the like may be used as the recording part. Besides mounting the recording part on the reel 65, a recording part may be mounted on a part supply tape per se by printing a two dimensional code on a part supply tape 60.

REFERENCE EXAMPLES

Figure 19:
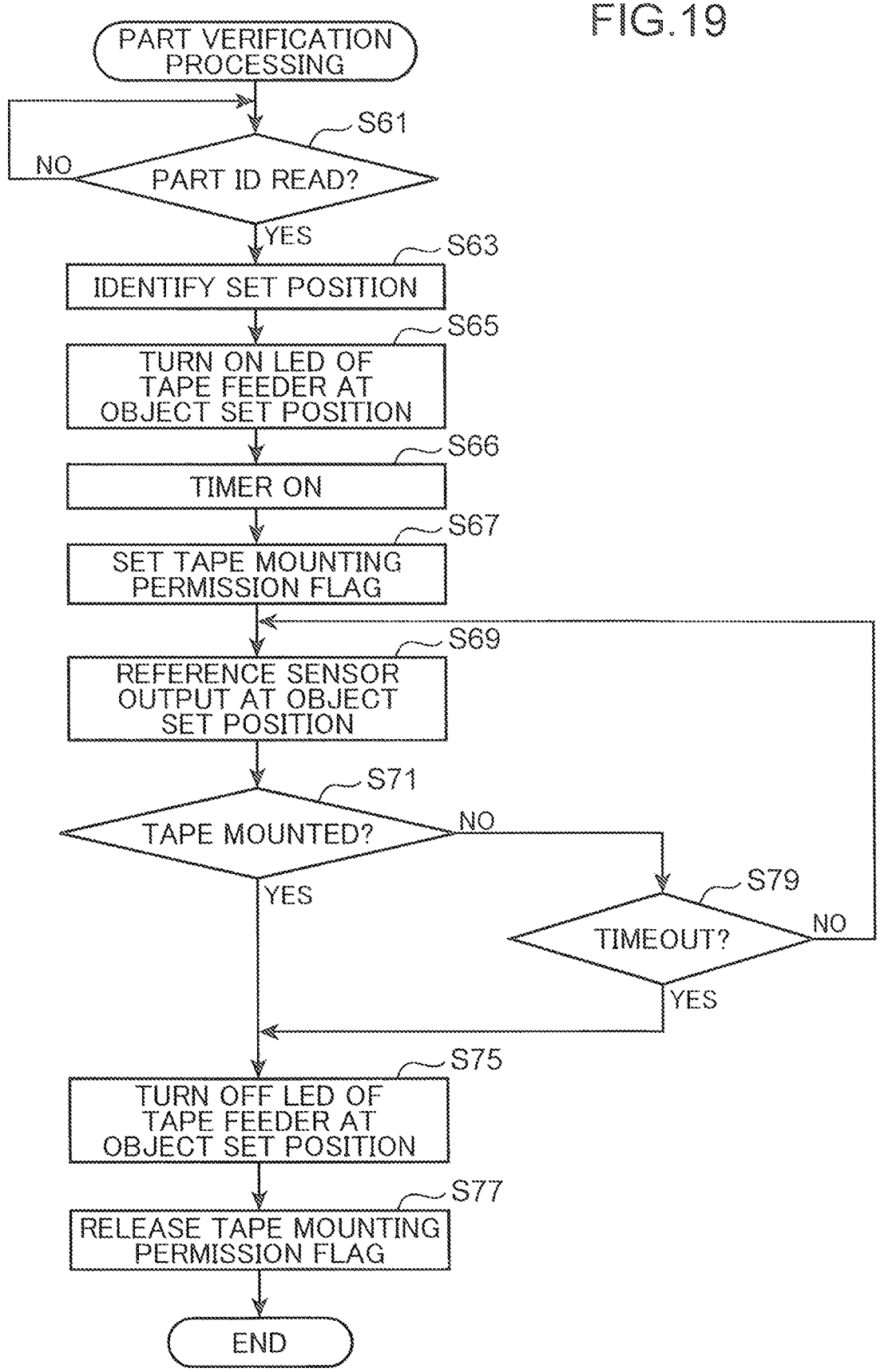
FIG. 19 is a flowchart showing a reference example of part verification processing.
Figure 20:
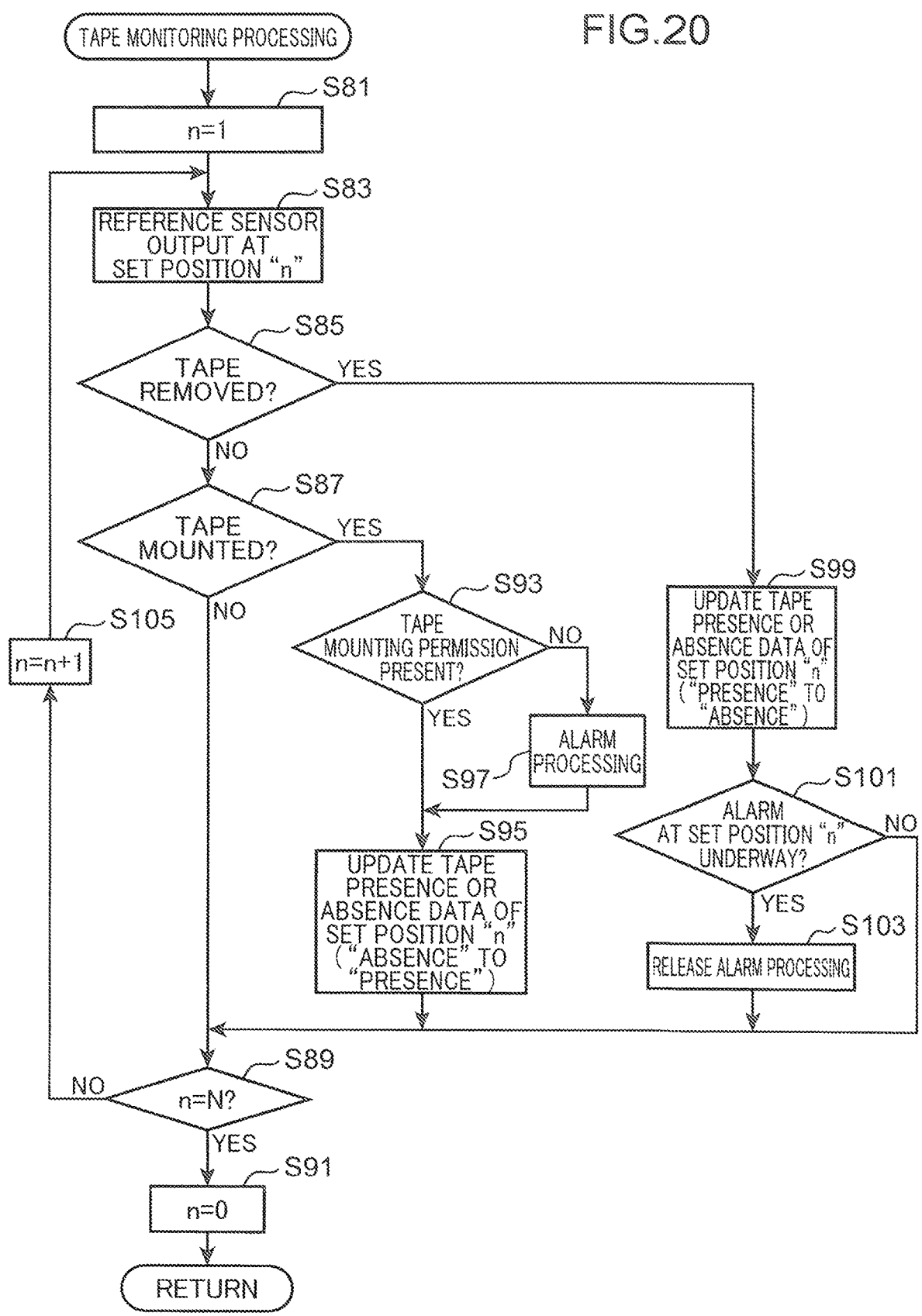
FIG. 20 is a flowchart showing a reference example of tape monitoring processing.

In part verification processing which the part verification part 71b performs and in tape monitoring processing which the tape erroneous mounting detection part 71c performs, besides the processing described in the flowcharts shown in FIG. 11 and FIG. 12, processing described in flowcharts shown in FIG. 19 and FIG. 20 are also applicable.

Although the examples described in FIG. 19 and FIG. 20 are respectively modifications of the examples shown in FIG. 11 and FIG. 12, the examples shown in FIG. 19 and FIG. 20 depart from the present disclosure with respect to points described later. However, the examples shown in FIG. 19 and FIG. 20 can overcome the drawback shared in common with the present disclosure that when a tape for supplying parts is not properly mounted on a tape feeder, such erroneous mounting is detected. Accordingly, the examples shown in FIG. 19 and FIG. 20 are described as a reference example.

1. Part Verification Processing (Reference Example)

FIG. 19 is a flowchart showing the reference example of the part verification processing.

Firstly, the part verification part 71b waits reading of a part ID (barcode 66) by a barcode reader 84 (step S61). When the part ID is read (Yes in step S61), an object set position is identified based on the part ID and part verification data in a database (see FIG. 10), and turns on (or flickers) the LED display part 51b of the object feeder 5 and, at the same time, operates a timer part 71d (steps S63 to S66).

Next, the part verification part 71*b* sets a tape mounting permission flag at an object set position (step S67) and, thereafter, the part verification part 71*b* references an output signal from a second tape detection sensor 48*b* of the object feeder 5, and determines whether or not a tape 60 is mounted on the object feeder 5 (step S71).

If the determination result is Yes in step S71, the part verification part 71*b* turns off the LED display part 51*b* of the object feeder 5 and, further, finishes the part verification processing after the part mounting permission flag is released (steps S75, S77). On the other hand, if the determination result is No in step S71, the part verification part 71*b* determines whether or not a timeout is made, that is, whether or not a set time is counted by the timer part 71*d* (step S79). Then, if the determination result is No in step S79, processing advances to step S69, while is the determination result is Yes in step S79, processing advances to step S75.

When the determination result is Yes in step S71, it is confirmed by the part verification part 71*b* that part verification is correctly performed, that is, the tape 60 which supplies the part having the desired part ID is set at the correct set position. The part verification part 71*b* stores this information in the memory part 72, and performs loading of the tape 60 when a loading command of the tape 60 is issued due to the detection of the part running out of the preceding tape 60 or an operation of an operation button 51*a*.

2. Tape Monitoring Processing (Reference Example)

FIG. 20 is a flowchart showing a reference example of a tape monitoring processing.

Firstly, the tape erroneous mounting detection part 71*c* sets a counter value of the set position counter to an initial value "1" (step S81), and determines whether or not the tape 60 is removed from the tape feeder 5 by referencing an output signal of the second tape detection sensor 48*b* at the set position "n" (step S83)(step S85). If the determination result is Yes in step S85, the tape erroneous mounting detection part 71*c* changes data at the set position "n" from "presence" to "absence" in the tape presence or absence data, and stores the tape presence or absence data in an updated manner (step S99). Then, the tape erroneous mounting detection part 71*c* determines whether or not alarm processing described later is performed with respect to the tape feeder 5 at the set position "n" (step S101). When the tape erroneous mounting detection part 71*c* determines that alarm processing is performed, the tape erroneous mounting detection part 71*c* stops such alarm processing (step S103). Then, the tape erroneous mounting detection part 71*c* advances processing to step S89.

If the determination result is No in step S85, the tape erroneous mounting detection part 71*c* determines whether or not the tape 60 is mounted on the tape feeder 5 at the set position "n" (step S87). If the determination result is No in step S87, the tape erroneous mounting detection part 71*c* advances processing to step S89.

On the other hand, if the determination result is Yes in step S87, the tape erroneous mounting detection part 71*c* determines whether or not tape mounting permission exists, that is, whether or not a tape mounting permission flag is set (step S67 in FIG. 19). If the determination result is No in step S67, the tape erroneous mounting detection part 71*c* performs alarm processing (step S97) and, thereafter, changes data at the set position "n" in tape presence or absence data from "absence" to "presence", and stores the tape presence or absence data in an updated manner (step S95), and processing advances to step S89. On the other hand, if the determination result is Yes in step S93, the tape erroneous mounting detection part 71*c* advances processing to step S95 without performing alarm processing.

In step S89, the tape erroneous mounting detection part 71*c* determines whether or not a counter value of the set position counter is equal to the total number N of the set positions. If the determination result is No in step S89, the tape erroneous mounting detection part 71*c* increments the counter value by "1", and advances processing to step S83 (step S105). If the determination result is Yes in step S89, the tape erroneous mounting detection part 71*c* resets the counter value to "0" (step S91) and, thereafter, returns processing to step S81.

3. Functions and Effects of Reference Examples

The functions and effects of the reference examples are substantially equal to the functions and effects acquired by the examples shown in FIG. 11 and FIG. 12. That is, when an operator reads the barcode 66 attached to the reel 65 using the barcode reader 84, the LED display part 51*b* of the object feeder 5 is turned on. Accordingly, the operator can speedily mount the tape 60 on the object feeder 5 using lighting of the LED display part 51*b* as a key. Then, when the tape 60 is properly mounted on the object feeder 5, the LED display part 51*b* is turned off. In this case, data of the object set position in the tape presence or absence data is updated in tape monitoring processing (step S95 in FIG. 21).

On the other hand, when the above-mentioned first and second instances occur, that is, in the case where an operator mounts the tape 60 on the tape feeder 5 without performing reading of the barcode 66 or in the case where an operator is not aware of a fact that the tape 60 is mounted on the tape feeder 5 which is not an object although the operator performs reading of the barcode 66 and leaves such a situation, alarm processing is performed (step S97 in FIG. 20). Accordingly, even when the erroneous operation described in the first instance or the erroneous mounting of the tape 60 described in the second instance occurs, such a situation can be detected, and it is possible to suppress the occurrence of a trouble such as a defect in supplying parts to the tape feeder 5 caused by leaving such a state.

In this manner, the functions and effects of the reference examples are basically substantially equal to the functions and effects acquired by the examples shown in FIG. 11 and FIG. 12. However, there exists a following large difference between the above-mentioned embodiment and the above-mentioned reference examples. That is, in tape monitoring processing shown in FIG. 12 which has been described previously, substantial processing for detecting erroneous mounting of the tape 60 (processing in steps S35 to S39 and steps S45 to S49 in FIG. 12) is performed during a period which differs from a period in which part verification processing is performed. On the other hand, in tape monitoring processing shown in FIG. 20, processing for detecting erroneous mounting of tape 60 (processing in steps S83 to S87 and steps S93 to S99 in FIG. 20) is performed regardless of whether or not part verification processing is underway.

The present disclosure which has been described heretofore can be recapitulated as follows.

The present disclosure provides a tape erroneous mounting detection system disposed in a part supply unit where a plurality of tape feeders are arranged and provided for detecting that a tape for supplying a part is erroneously mounted on the tape feeder, the tape erroneous mounting detection system including: sensors provided to the plurality of tape feeders, the sensors being configured to detect tapes, respectively; a reader configured to read identification information of an accommodated part from a recording part which records the identification information and is provided to a tape or a reel around which the tape is wound; a memory part configured to store part verification information obtained by correlating set position information with the identification information, the set position information being information on a set position of the tape feeders in the part supply unit; a part verification part configured to determine whether or not the tape is mounted on the tape feeder at the set position corresponding to the identification information read by the reader based on the identification information read by the reader, the part verification information, and an output from the sensor, and configured to perform verification updating processing so as to update tape presence or absence information at the set position in a case where determination is made that the tape is mounted on the tape feeder; and a tape erroneous mounting detection part configured to perform erroneous mounting detection processing where the tape feeder on which the tape is mounted is identified based on the tape presence or absence information and the output from the sensor, and detects that the tape mounted on the tape feeder is erroneously mounted during a period which differs from a period where the verification updating processing is performed.

According to this tape erroneous mounting detection system, when the tape is mounted on the tape feeder in a state where reading of identification information is not performed by the reader, verification updating processing is not performed (tape presence or absence information is not updated). Accordingly, in erroneous mounting detection processing, the tape is detected as the tape which is mounted during the period which differs from the period during which verification updating processing is performed, that is, the tape is detected as the tape which is erroneously mounted. In this case, the tape is regarded as the tape which is erroneously mounted regardless of whether or not the tape is mounted on the tape feeder at the set position corresponding to the identification information. In this manner, according to the tape erroneous mounting detection system, it is possible to prevent the occurrence of a situation where the tape mounted on the tape feeder is left as it is in a state where reading of identification information is not performed by the reader.

It is preferable that the above-mentioned tape erroneous mounting detection system further include a notification part configured to visually identify the set position at which the erroneous mounting occurs or the tape feeder set at the set position when erroneous mounting of the tape occurs.

With such a configuration, it is possible to speedily identify the set position at which erroneous mounting of a tape occurs or the tape feeder set at such a set position. Accordingly, the erroneous mounting can be eliminated by speedily remounting the tape.

It is preferable that the above-mentioned tape erroneous mounting detection system further include a timer part configured to measure a time which is preset as a time within which the tape is mountable on the tape feeder and the tape is remountable in synchronism with reading of the identification information by the reader, wherein the part verification part be configured to update tape presence or absence information when the tape is mounted on the tape feeder at the set position corresponding to the identification information read by the reader during a period until measurement of the set time by the timer part is completed.

With such a configuration, even when the tape whose identification information is read by the reader is erroneously mounted on the tape feeder at the set position different from the set position corresponding to the identification information, it is possible to prevent mounting of the tape from being detected as erroneous mounting by remounting the tape within the set time. Accordingly, it is possible to eliminate cumbersomeness where the case in which an operator is immediately aware of erroneous mounting and can remount the tape is also detected as erroneous mounting indiscriminately.

In this case, it is preferable that the set time be a time during which the tape is remountable on the tape feeder plural times.

With such a configuration, an operator can remount the tape with further tolerance. Accordingly, the operator can perform the tape remounting operation more accurately and with more certainty.

In this case, it is preferable that the part verification part be configured to perform first detection processing for detecting presence or absence of the tape at each of the tape feeders prior to the verification updating processing, be configured to perform second detection processing for detecting presence or absence of the tape at each of the tape feeders after updating of the tape presence or absence information in the verification updating processing, and be configured to perform reset processing for resetting tape presence or absence information which is updated in the verification updating processing to the information before updating when a total number of tapes detected by the second detection processing is increased by 2 or more compared to a total number of the tapes detected in the first detection processing.

With such a configuration, there is no possibility that, the tape having identification information read by the reader is mounted on the tape feeder which differs from the tape feeder at the set position corresponding to the identification information (object set position) within the above-mentioned set time, and reading of the identification information is performed by the reader within the above-mentioned set time. Accordingly, it is possible to avoid missing of erroneous mounting of the tape mounted on the tape feeder at the object set position when another tape is mounted on the tape feeder at the object set position.

It is preferable that the above-mentioned tape erroneous mounting detection system further include a display part configured to visually identify the set position corresponding to the identification information read by the reader or the tape feeder set at the set position.

With such a configuration, in mounting the tape, the position of the tape feeder corresponding to identification information can be easily grasped. Accordingly, the configuration contributes to the reduction of the occurrence of erroneous mounting of the tape.

In this case, it is preferable that the display part be provided to each of the plurality of tape feeders.

With such a configuration, the positions of the tape feeders corresponding to identification information can be more easily grasped.

What is claimed is:

1. A tape erroneous mounting detection system disposed in a part supply unit where a plurality of tape feeders are arranged and provided for detecting that a tape for supplying a part is erroneously mounted on the tape feeder, the tape erroneous mounting detection system comprising:
sensors provided to the plurality of tape feeders, the sensors being configured to detect presence or absence of tapes, respectively;
a reader configured to read identification information of an accommodated part from a recorder which records the identification information and is provided to a tape or a reel around which the tape is wound;

a memory configured to store part verification information obtained by correlating set position information with the identification information, the set position information being information on a set position of the tape feeders in the part supply unit;

a part verifier configured to determine whether or not the tape is mounted on the tape feeder at the set position corresponding to the identification information read by the reader based on the identification information read by the reader, the part verification information, and an output from the sensor, and configured to perform verification updating processing so as to update tape presence or absence information at the set position in a case where determination is made that the tape is mounted on the tape feeder; and a tape erroneous mounting detector configured to perform erroneous mounting detection processing where the tape erroneous mounting detector identifies the tape feeder on which the tape is mounted based on the tape presence or absence information and the output from the sensor, and the tape erroneous mounting detector detects that the tape mounted on the tape feeder is erroneously mounted during a period which differs from a period where the verification updating processing is performed.

2. The tape erroneous mounting detection system according to claim 1, further comprising a notifier configured to visually identify the set position at which the erroneous mounting occurs or the tape feeder set at the set position when erroneous mounting of the tape occurs.

3. The tape erroneous mounting detection system according to claim 1, further comprising a timer configured to measure a time which is preset as a time within which the tape is mountable on the tape feeder and the tape is remountable in synchronism with reading of the identification information by the reader, wherein the part verifier is configured to update tape presence or absence information when the tape is mounted on the tape feeder at the set position corresponding to the identification information read by the reader during a period until measurement of the set time by the timer is completed.

4. The tape erroneous mounting detection system according to claim 3, wherein the set time is a time during which the tape is remountable on the tape feeder plural times.

5. The tape erroneous mounting detection system according to claim 3, wherein the part verifier is configured to perform first detection processing for detecting presence or absence of the tape at each of the tape feeders prior to the verification updating processing, is configured to perform second detection processing for detecting presence or absence of the tape at each of the tape feeders after updating of the tape presence or absence information in the verification updating processing, and is configured to perform reset processing for resetting tape presence or absence information which is updated in the verification updating processing to the information before updating when a total number of tapes detected by the second detection processing is increased by 2 or more compared to a total number of the tapes detected in the first detection processing.

6. The tape erroneous mounting detection system according to claim 1, further comprising a display configured to visually identify the set position corresponding to the identification information read by the reader or the tape feeder set at the set position.

7. The tape erroneous mounting detection system according to claim 6, wherein the display is provided to each of the plurality of tape feeders.

8. The tape erroneous mounting detection system according to claim 2, further comprising a timer configured to measure a time which is preset as a time within which the tape is mountable on the tape feeder and the tape is remountable in synchronism with reading of the identification information by the reader, wherein the part verifier is configured to update tape presence or absence information when the tape is mounted on the tape feeder at the set position corresponding to the identification information read by the reader during a period until measurement of the set time by the timer is completed.

9. The tape erroneous mounting detection system according to claim 8, wherein the set time is a time during which the tape is remountable on the tape feeder plural times.

10. The tape erroneous mounting detection system according to claim 8, wherein the part verifier is configured to perform first detection processing for detecting presence or absence of the tape at each of the tape feeders prior to the verification updating processing, is configured to perform second detection processing for detecting presence or absence of the tape at each of the tape feeders after updating of the tape presence or absence information in the verification updating processing, and is configured to perform reset processing for resetting tape presence or absence information which is updated in the verification updating processing to the information before updating when a total number of tapes detected by the second detection processing is increased by 2 or more compared to a total number of the tapes detected in the first detection processing.

11. The tape erroneous mounting detection system according to claim 9, wherein the part verifier is configured to perform first detection processing for detecting presence or absence of the tape at each of the tape feeders prior to the verification updating processing, is configured to perform second detection processing for detecting presence or absence of the tape at each of the tape feeders after updating of the tape presence or absence information in the verification updating processing, and is configured to perform reset processing for resetting tape presence or absence information which is updated in the verification updating processing to the information before updating when a total number of tapes detected by the second detection processing is increased by 2 or more compared to a total number of the tapes detected in the first detection processing.

12. The tape erroneous mounting detection system according to claim 2, further comprising a display configured to visually identify the set position corresponding to the identification information read by the reader or the tape feeder set at the set position.

13. The tape erroneous mounting detection system according to claim 3, further comprising a display configured to visually identify the set position corresponding to the identification information read by the reader or the tape feeder set at the set position.

14. The tape erroneous mounting detection system according to claim 4, further comprising a display configured to visually identify the set position corresponding to the identification information read by the reader or the tape feeder set at the set position.

15. The tape erroneous mounting detection system according to claim 5, further comprising a display configured to visually identify the set position corresponding to the identification information read by the reader or the tape feeder set at the set position.

16. The tape erroneous mounting detection system according to claim 8, further comprising a display configured to visually identify the set position corresponding to the identification information read by the reader or the tape feeder set at the set position.

17. The tape erroneous mounting detection system according to claim 12, wherein the display is provided to each of the plurality of tape feeders.

18. The tape erroneous mounting detection system according to claim 13, wherein the display is provided to each of the plurality of tape feeders.

19. The tape erroneous mounting detection system according to claim 14, wherein the display is provided to each of the plurality of tape feeders.

20. The tape erroneous mounting detection system according to claim 15, wherein the display is provided to each of the plurality of tape feeders.

* * * * *